US012260885B2

(12) United States Patent
Okano et al.

(10) Patent No.: US 12,260,885 B2
(45) Date of Patent: Mar. 25, 2025

(54) DISK DEVICE HAVING COMPONENTS THAT COMMUNICATE WITH EACH OTHER VIA CONVERSION DEVICES

(71) Applicants: Kabushiki Kaisha Toshiba, Tokyo (JP); Toshiba Electronic Devices & Storage Corporation, Tokyo (JP)

(72) Inventors: Taichi Okano, Yokohama Kanagawa (JP); Jia Liu, Yokohama Kanagawa (JP); Masahide Takazawa, Yokohama Kanagawa (JP); Nobuhiro Takazawa, Yokohama Kanagawa (JP); Kota Tokuda, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 174 days.

(21) Appl. No.: 17/469,410

(22) Filed: Sep. 8, 2021

(65) Prior Publication Data
US 2022/0301595 A1 Sep. 22, 2022

(30) Foreign Application Priority Data
Mar. 18, 2021 (JP) .................. 2021-044837

(51) Int. Cl.
*G11B 33/12* (2006.01)
*G06F 3/06* (2006.01)
(Continued)

(52) U.S. Cl.
CPC .......... *G11B 33/122* (2013.01); *G06F 3/0676* (2013.01); *G11B 25/043* (2013.01);
(Continued)

(58) Field of Classification Search
None
See application file for complete search history.

(56) References Cited

U.S. PATENT DOCUMENTS 8,547,804 B2 10/2013 Shimizu
2006/0007794 A1 1/2006 Matsui
(Continued)

FOREIGN PATENT DOCUMENTS

JP H05-28402 A 2/1993
JP H07-21704 A 1/1995
(Continued)

*Primary Examiner* — Craig A. Renner
(74) *Attorney, Agent, or Firm* — Maier & Maier, PLLC

(57) ABSTRACT

A disk device according to one embodiment includes a first conversion device, a second conversion device, an optical waveguide, a first component, and a second component. The first conversion device emits light corresponding to an electric signal. The second conversion device generates an electric signal corresponding to incident light. The optical waveguide includes a first end joined to the first conversion device and a second end joined to the second conversion device, and transmits light emitted from the first conversion device to the second conversion device. The first component is electrically connected to the first conversion device. The second component is electrically connected to the second conversion device, and communicates with the first component through the first conversion device, the optical waveguide, and the second conversion device.

12 Claims, 9 Drawing Sheets

(51) Int. Cl.
  *G11B 25/04* (2006.01)
  *G11B 33/02* (2006.01)
  *H05K 1/11* (2006.01)
(52) U.S. Cl.
  CPC .......... *G11B 33/022* (2013.01); *G11B 33/124* (2013.01); *H05K 1/118* (2013.01)

(56) References Cited

U.S. PATENT DOCUMENTS

| | | | |
|---|---|---|---|
| 2006/0023330 A1 | 2/2006 | Matsui | |
| 2010/0195473 A1* | 8/2010 | Tsuyama | G11B 5/4866 369/102 |
| 2010/0271690 A1* | 10/2010 | Kawakita et al. | G11B 7/127 359/344 |
| 2011/0123145 A1* | 5/2011 | Nishio | G11B 5/4866 385/14 |
| 2023/0005504 A1* | 1/2023 | Gomez et al. | G11B 13/045 |

FOREIGN PATENT DOCUMENTS

| | | |
|---|---|---|
| JP | 2006-024316 A | 1/2006 |
| JP | 2006-024318 A | 1/2006 |
| JP | 2011-065724 A | 3/2011 |
| JP | 2012-048797 A | 3/2012 |
| JP | 2013-004160 A | 1/2013 |
| JP | 2016-021274 A | 2/2016 |
| WO | 2009/050770 A | 4/2009 |
| WO | 2009/096471 A1 | 8/2009 |

\* cited by examiner

DISK DEVICE HAVING COMPONENTS
THAT COMMUNICATE WITH EACH OTHER
VIA CONVERSION DEVICES

CROSS-REFERENCE TO RELATED
APPLICATIONS

This application is based upon and claims the benefit of priority from Japanese Patent Application No. 2021-044837, filed on Mar. 18, 2021; the entire contents of which are incorporated herein by reference.

FIELD

Embodiments described herein relate generally to a disk device.

BACKGROUND

Disk devices such as a hard disk drive transmit various electric signals via interconnections including an interconnect pattern on a board and a terminal of a connector. Examples of the electric signals include, a write signal representing information to be written by a magnetic head onto a recording medium and a read signal representing information read by the magnetic head from the recording medium.

The number of interconnections in such a disk device has been increasing along with an increase in storage capacity thereof. For example, as the number of storage media increases, the number of magnetic heads that read and write information from and to the storage media increases, and the number of interconnections to the magnetic heads also increases.

DETAILED DESCRIPTION

According to one embodiment, a disk device includes a first conversion device, a second conversion device, an optical waveguide, a first component, and a second component. The first conversion device emits light corresponding to an electric signal. The second conversion device generates an electric signal corresponding to incident light. The optical waveguide includes a first end joined to the first conversion device, and a second end joined to the second conversion device, the optical waveguide that transmits light emitted from the first conversion device to the second conversion device. The first component is electrically connected to the first conversion device. The second component is electrically connected to the second conversion device, the second component that communicates with the first component through the first conversion device, the optical waveguide, and the second conversion device.

First Embodiment

Hereinbelow, a first embodiment will be described with reference to FIGS. 1 to 6. Note that, in the present specification, components according to embodiments and descriptions of the components may be described in a plurality of expressions. The components and the descriptions thereof are illustrative only and are not limited by the expressions in the present specification. The components can also be identified by different names from those in the present specification. Also, the components can also be described by different expressions from those in the present specification.

Figure 1:
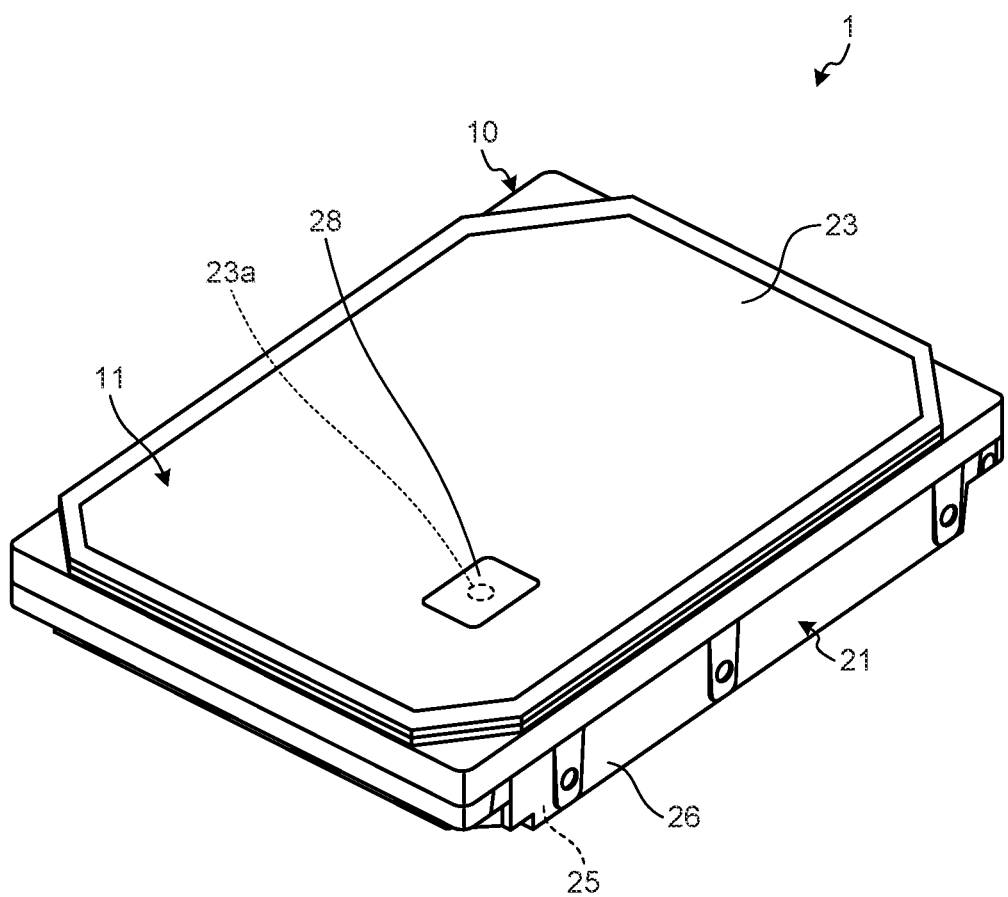
FIG. 1 is an exemplary perspective view illustrating a hard disk drive (HDD) according to a first embodiment.

FIG. 1 is an exemplary perspective view illustrating a hard disk drive (HDD) 10 according to the first embodiment. The HDD 10 is incorporated in an electronic device 1, for example, and constitutes a part of the electronic device 1. In other words, the electronic device 1 includes the HDD 10.

The HDD 10 is an example of a disk device, and may also be referred to as a storage device or a magnetic disk device. Examples of the electronic device 1 include various computers such as a personal computer, a supercomputer, a server, a television receiver, and a game machine, and devices such as an external hard drive (external HDD).

Figure 2:
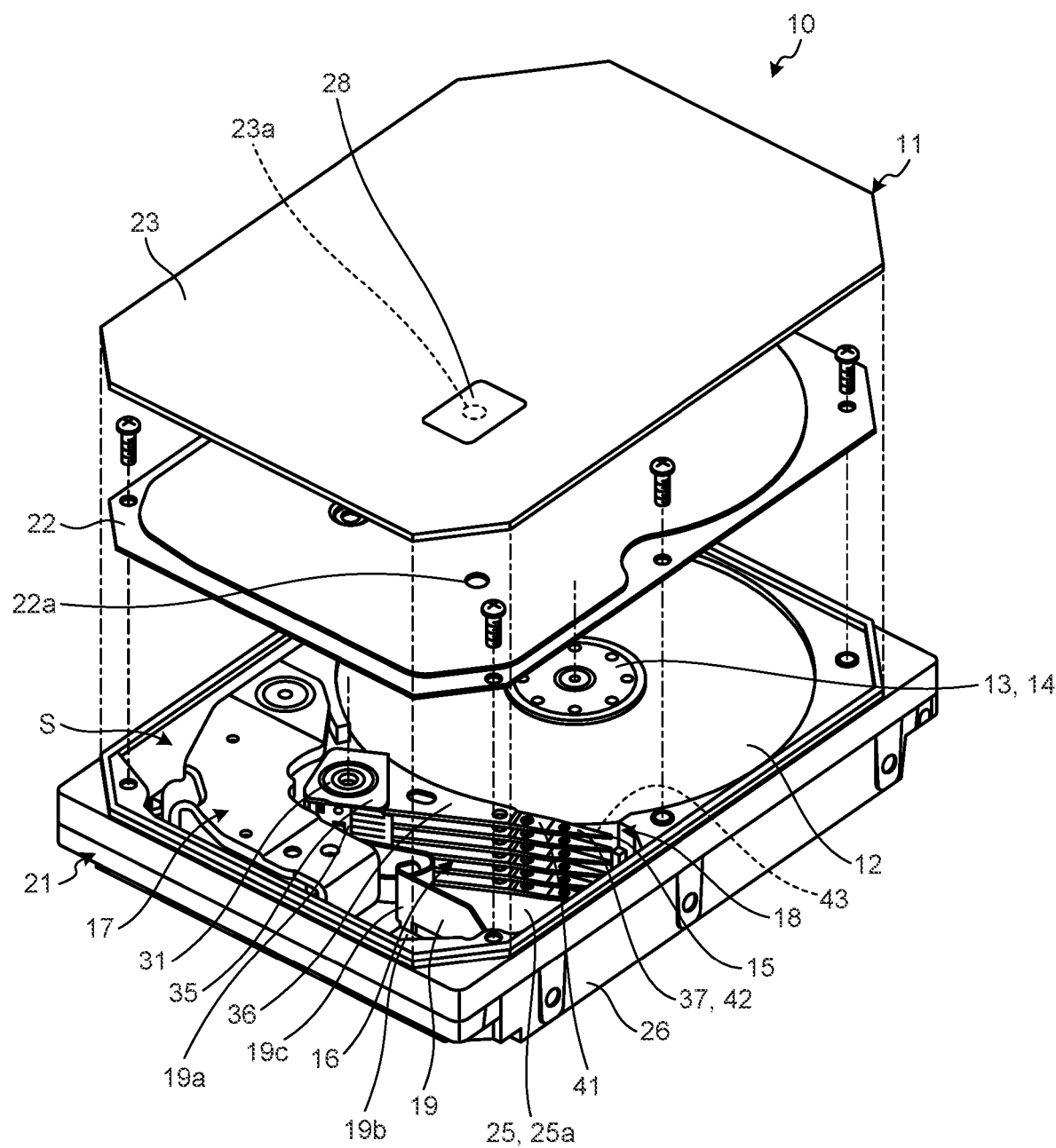
FIG. 2 is an exemplary perspective view illustrating the HDD according to the first embodiment in an exploded manner.

FIG. 2 is an exemplary perspective view illustrating the HDD 10 according to the first embodiment in an exploded manner. As illustrated in FIG. 2, the HDD 10 includes a chassis 11, a plurality of magnetic disks 12, a spindle motor 13, a clamp spring 14, a plurality of magnetic heads 15, an actuator assembly 16, a voice coil motor (VCM) 17, a ramp loading mechanism 18, and a flexible printed circuit board (FPC) 19. The magnetic disk 12 is an example of a recording medium. The actuator assembly 16 is an example of an actuator. The FPC 19 is an example of a first flexible printed circuit board.

The chassis 11 includes a base 21, an inner cover 22, and an outer cover 23. The base 21 is a bottomed container and includes a bottom wall 25 and sidewalls 26. The bottom wall 25 is an example of a first wall. The bottom wall 25 has substantially a rectangular (quadrangular) plate shape. The sidewalls 26 protrude from the outer edge of the bottom wall 25. The bottom wall 25 and the sidewalls 26 are integrally made of, for example, a metal material such as an aluminum alloy.

The inner cover 22 and the outer cover 23 are made of, for example, a metal material such as an aluminum alloy. The inner cover 22 is attached to the end of the sidewalls 26 with, for example, screws. The outer cover 23 covers the inner cover 22 and is airtightly secured to the end of the sidewall 26 by, for example, welding.

The chassis 11 has an internal space S. The internal space S is formed (defined or sectioned) by the base 21 and the inner cover 22. According to the present embodiment the internal space S of the chassis 11 is airtightly sealed to prevent or reduce a flow of gas between the internal space S and the outside of the chassis 11.

The chassis 11 accommodates various components including the magnetic disks 12, the spindle motor 13, the clamp spring 14, the magnetic heads 15, the actuator assembly 16, the voice coil motor 17, the ramp loading mechanism 18, and the FPC 19 in the internal space S. The internal space S and the various components housed in the internal space S are covered with the bottom wall 25 and the sidewalls 26 of the base 21 and the inner cover 22.

The inner cover 22 is provided with a vent 22a. The outer cover 23 is provided with a vent 23a. After the components are attached to the inside of the base 21, and the inner cover 22 and the outer cover 23 are attached to the base 21, the air is removed from the internal space S through the vents 22a and 23a. Further, the internal space S is filled with a gas different from the air.

Examples of the gas with which the internal space S is filled include a low density gas lower in density than the air and an inert gas having low reactivity. For example, the internal space S is filled with helium. The internal space S may be filled with another fluid. Alternatively, the internal space S may be maintained in a vacuum state, at low pressure close to the vacuum state, or at negative pressure lower than atmospheric pressure.

The vent 23a of the outer cover 23 is closed by a seal 28. The seal 28 is made of, for example, metal or synthetic resin. The seal 28 airtightly seals the vent 23a and prevents the gas from leaking from the internal space S through the vent 23a.

Each magnetic disk 12 is, for example, a disk including a magnetic recording layer on at least one of the upper surface and the lower surface thereof. The diameter of the magnetic disk 12 is, for example, 3.5 inches, but is not limited to this example.

The spindle motor 13 supports and rotates the magnetic disks 12 stacked on each other with spacing. The clamp spring 14 holds the magnetic disks 12 on the hub of the spindle motor 13.

The magnetic heads 15 record and reproduce information on and from the recording layers of the magnetic disks 12. In other words, the magnetic heads 15 read and write information from and to the magnetic disks 12. The magnetic heads 15 are supported by the actuator assembly 16.

The actuator assembly 16 is rotatably supported by a support shaft 31 spaced away from the magnetic disks 12. The VCM 17 rotates the actuator assembly 16 to place the actuator assembly 16 at a desired position. When the magnetic head 15 moves to the outermost periphery of the magnetic disk 12 due to rotation of the actuator assembly 16 by means of the VCM 17, the ramp loading mechanism 18 holds the magnetic head 15 at an unloading position away from the magnetic disk 12.

The actuator assembly 16 includes an actuator block 35, a plurality of arms 36, and a plurality of head suspension assemblies 37. The head suspension assembly 37 can also be referred to as a head gimbal assembly (HGA).

The actuator block 35 is rotatably supported by the support shaft 31 via a bearing, for example. The arms 36 protrude from the actuator block 35 in a direction substantially orthogonal to the support shaft 31. Note that the actuator assembly 16 may be divided, and the arms 36 may protrude from the actuator blocks 35, respectively.

The arms 36 are spaced from each other in a direction in which the support shaft 31 extends. Each of the arms 36 has a plate shape that can enter a gap between the adjacent magnetic disks 12. The arms 36 extend substantially in parallel.

The actuator block 35 and the arms 36 are integrally made of, for example, aluminum. Note that the material of the actuator block 35 and the arms 36 is not limited to this example.

The actuator block 35 is provided with a protrusion on which a voice coil of the VCM 17 is placed. The VCM 17 includes a pair of yokes, a voice coil placed between the yokes, and a magnet set on the yoke.

The head suspension assemblies 37 are attached to the tip ends of the corresponding arms 36 and protrude from the arms 36. As a result, the head suspension assemblies 37 are spaced from each other in the direction in which the support shaft 31 extends.

Each head suspension assembly 37 includes a base plate 41, a load beam 42, and a flexure 43. The magnetic heads 15 are attached to the corresponding head suspension assemblies 37.

The base plate 41 and the load beam 42 are made of, for example, stainless steel. Note that the material of the base plate 41 and the load beam 42 is not limited to this example. The base plate 41 is attached to the tip end of the arm 36. The load beam 42 has a plate shape thinner in thickness than the base plate 41. The load beam 42 is attached to the tip end of the base plate 41 and protrudes from the base plate 41.

The flexure 43 has an elongated strip shape. Note that the shape of the flexure 43 is not limited to this example. The flexure 43 is a layered plate including a metal plate (underlayer) made of stainless steel or the like, an insulating layer formed on the metal plate, a conductive layer formed on the insulating layer and constituting a plurality of interconnections (interconnect pattern), and a protective layer (insulating layer) covering the conductive layer.

The flexure 43 includes, at one end, a displaceable gimbal (elastic support) located above the load beam 42. The magnetic head 15 is mounted on the gimbal. The other end of the flexure 43 is connected to the FPC 19. As a result, the FPC 19 is electrically connected to the magnetic head 15 via the interconnections of the flexure 43.

The VCM 17 rotates the actuator assembly 16, thereby moving the magnetic head 15 mounted on the gimbal of the actuator assembly 16 around the support shaft 31. That is, the actuator assembly 16 and the VCM 17 move the magnetic head 15.

Figure 3:
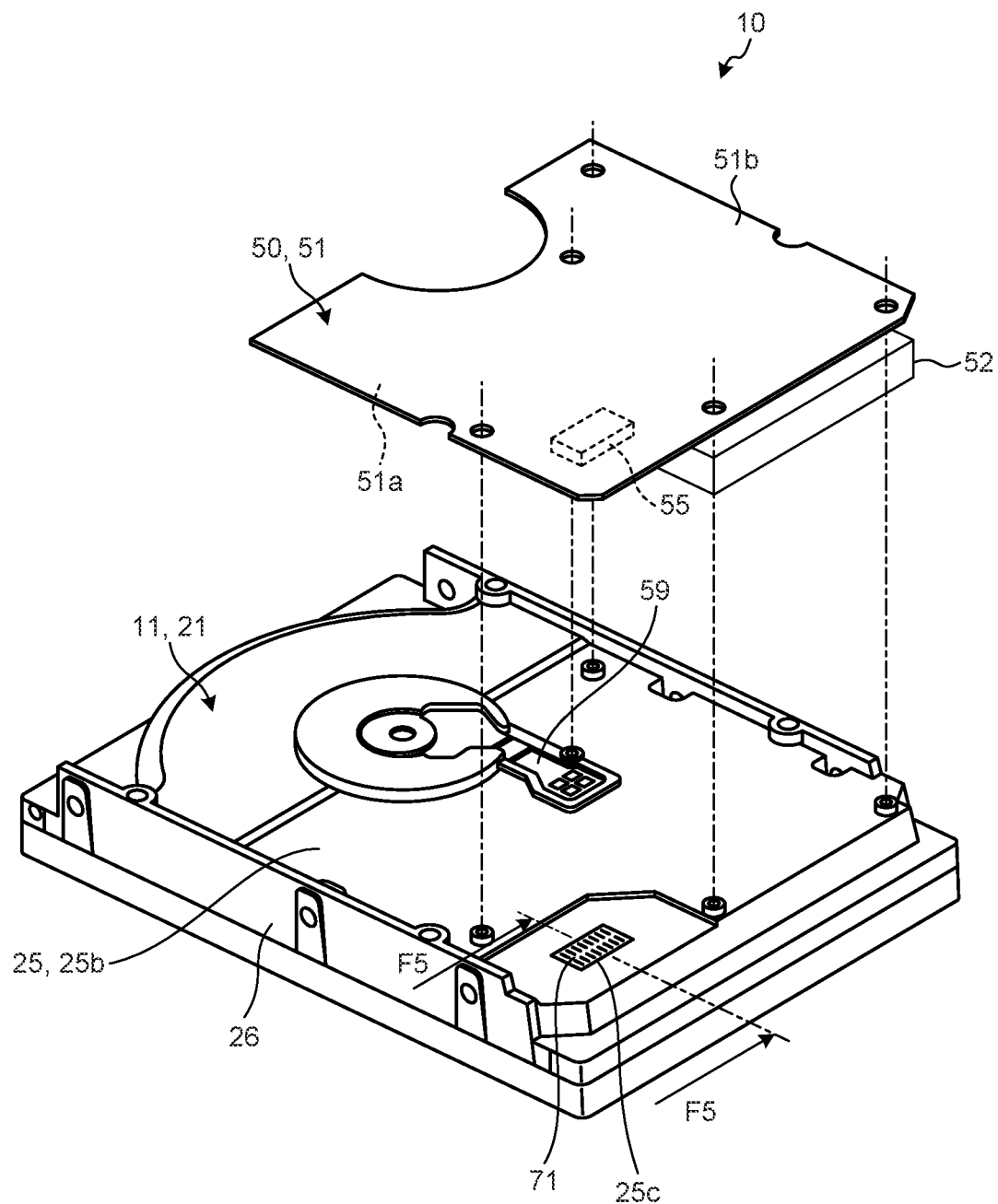
FIG. 3 is an exemplary perspective view illustrating the HDD according to the first embodiment in an exploded manner from a direction different from that in FIG. 2.

FIG. 3 is an exemplary perspective view illustrating the HDD 10 according to the first embodiment in an exploded manner from a different direction from that in FIG. 2. As illustrated in FIG. 3, the HDD 10 further includes a printed circuit board (PCB) 50. The PCB 50 is placed outside the bottom wall 25 of the base 21.

The PCB 50 includes a printed wiring board (PWB) 51 and a plurality of components mounted on the PWB 51. Examples of the PWB 51 includes a rigid board such as a glass epoxy board, a multilayer board, and a build-up board. The PWB 51 is attached to the outside of the bottom wall 25. In other words, the PWB 51 is attached to the outside of the chassis 11. The PWB 51 is attached to the bottom wall 25 by, for example, screwing or snap-fitting with hooks.

Figure 4:
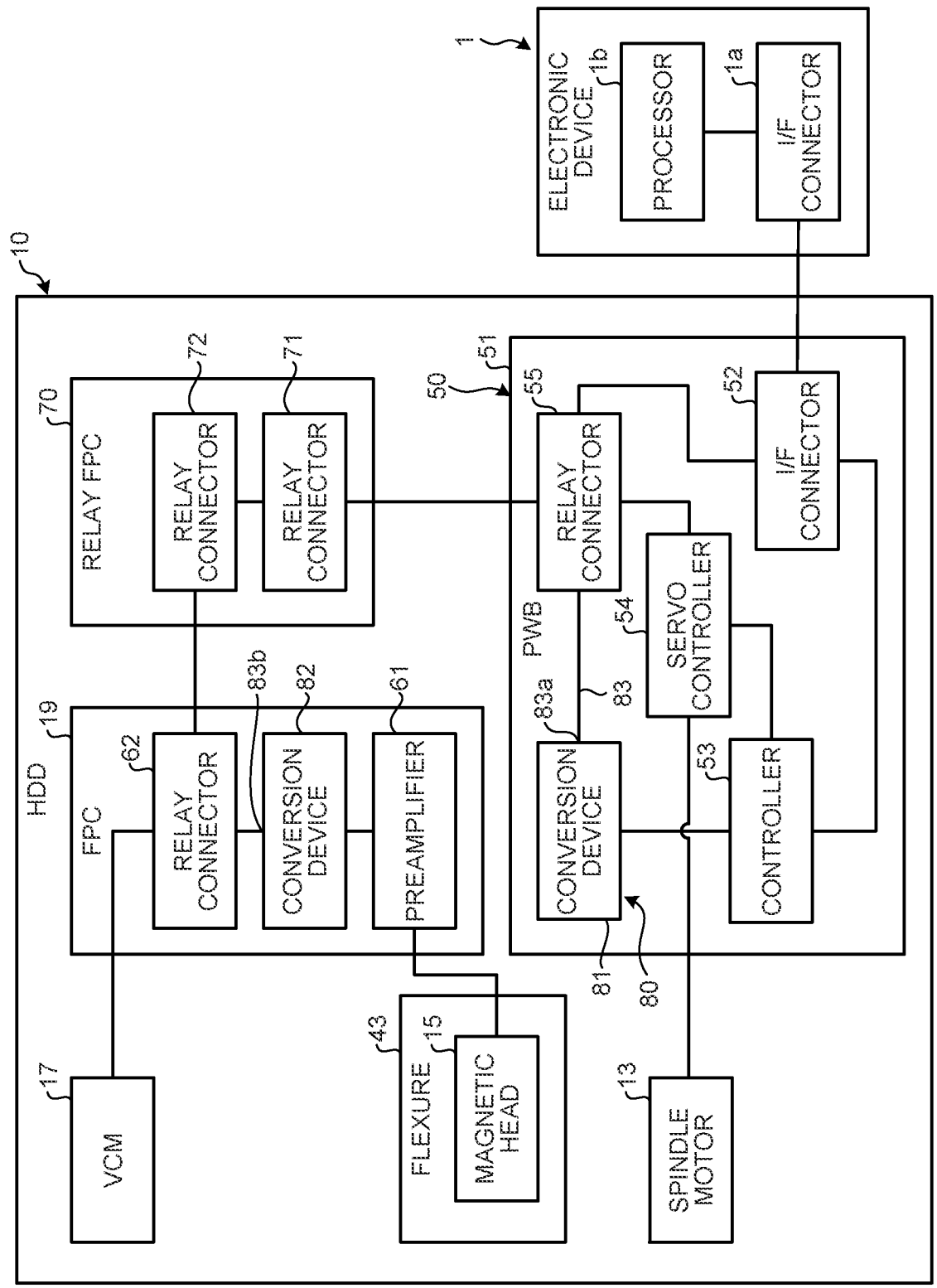
FIG. 4 is an exemplary block diagram illustrating a configuration of the HDD according to the first embodiment.

FIG. 4 is an exemplary block diagram illustrating a configuration of the HDD 10 according to the first embodiment. As illustrated in FIG. 4, the PCB 50 further includes an interface (I/F) connector 52, a controller 53, a servo controller 54, and a relay connector 55. The controller 53 is an example of a first component or a second component.

The I/F connector 52, the controller 53, the servo controller 54, and the relay connector 55 are mounted on the PWB 51. In addition, various memories such as a RAM, a ROM, and a buffer memory, a coil, a capacitor, and other electronic components are further mounted on the PWB 51.

The I/F connector 52 is a connector conforming to an interface standard such as Serial ATA, and is connected to an I/F connector 1a of the electronic device 1. Accordingly, the PWB 51 is electrically connected to a processor 1b of the electronic device 1. The processor 1b is, for example, a central processing unit (CPU), and controls the entire electronic device 1.

The HDD 10 is supplied with electric power and receives access commands (control signals) such as a write command and a read command and various kinds of data from the electronic device 1 through the I/F connector 52. The HDD 10 also transmits various kinds of data to the electronic device 1 through the I/F connector 52. In this manner, the HDD 10 performs wired communications with the electronic device 1 through the I/F connector 52. Note that the HDD 10 may be able to perform wireless communications with the electronic device 1.

The controller 53 includes, for example, a read/write channel (RWC), a hard disk controller (HDC), and a processor. The controller 53 may be one component, or may be a collective term for the RWC, the HDC, and the processor, which are independent from each other. The controller 53 performs control of the HDD 10 as a whole.

The servo controller 54 drives the spindle motor 13 and the VCM 17. The relay connector 55 is used, for example, for communicating with and supplying electric power to various components arranged in the internal space S.

As illustrated in FIG. 3, the HDD 10 further includes a relay FPC 59. The spindle motor 13 is electrically connected to the servo controller 54 of the PCB 50 through the relay FPC 59. The spindle motor 13 receives a drive signal from the servo controller 54 and is supplied with electric power from the PCB 50 via the relay FPC 59.

The relay FPC 59 is located in the vicinity of the spindle motor 13, and extends from the internal space S to the outside of the chassis 11 through a hole penetrating the bottom wall 25 of the base 21. The hole is sealed with, for example, synthetic resin.

The FPC 19 illustrated in FIG. 2 is elastically deformable and includes, for example, a conductive layer, an insulating layer, and an adhesive layer stacked on one another. The conductive layer is made of, for example, conductive metal such as copper. The insulating layer is made of, for example, insulating synthetic resin such as polyimide.

On the FPC 19, a preamplifier 61 and a relay connector 62 are mounted. The preamplifier 61 and the relay connector 62 are located in the internal space S of the chassis 11. The preamplifier 61 is an example of the first component or the second component. The preamplifier 61 is also an example of an amplifier.

The preamplifier 61 is electrically connected to the magnetic head 15 through the flexure 43. Note that the preamplifier 61 may be mounted on the flexure 43. The preamplifier 61 amplifies and outputs an input electric signal, for example.

The relay connector 62 is supplied with electric power via the relay connector 55 of the PWB 51. In the present embodiment, the magnetic head 15 and the preamplifier 61 operate by means of electric power supplied via the relay connector 62.

The HDD 10 further includes a relay FPC 70 and two relay connectors 71 and 72. The relay FPC 70 is an example of a first flexible printed circuit board or a second flexible printed circuit board. The relay connector 71 is an example of a first connector. The relay connector 72 is an example of a second connector.

As with the FPC 19, the relay FPC 70 is elastically deformable and includes, for example, a conductive layer, an insulating layer, and an adhesive layer stacked on one another. Note that the relay FPC 70 may be structured differently from the FPC 19.

The relay FPC 70 is attached to the bottom wall 25 of the chassis 11. The relay connectors 71 and 72 are disposed on the relay FPC 70. The relay connector 71 is located outside the chassis 11. The relay connector 71 is connected to the relay connector 55 of the PCB 50. The relay connector 72 is located in the internal space S of the chassis 11. The relay connector 72 is connected to the relay connector 62 of the FPC 19.

The processor 1b of the electronic device 1 and the controller 53 of the PCB 50 outside the chassis 11 communicate (transmit and receive data from and to) with the magnetic head 15 and the preamplifier 61 inside the chassis 11 via the relay connectors 55, 62, 71, and 72 and the relay FPC 70. Note that in the present embodiment the term "communication" refers to transmission and reception of information between independent elements. Thus, the processor 1b, the controller 53, the magnetic head 15, and the preamplifier 61 do not perform various kinds of control such as signal conversion for communication. The processor 1b, the controller 53, the magnetic head 15, and the preamplifier 61 have a relationship that when one outputs a signal, the other receives a signal corresponding to the signal.

Figure 5:
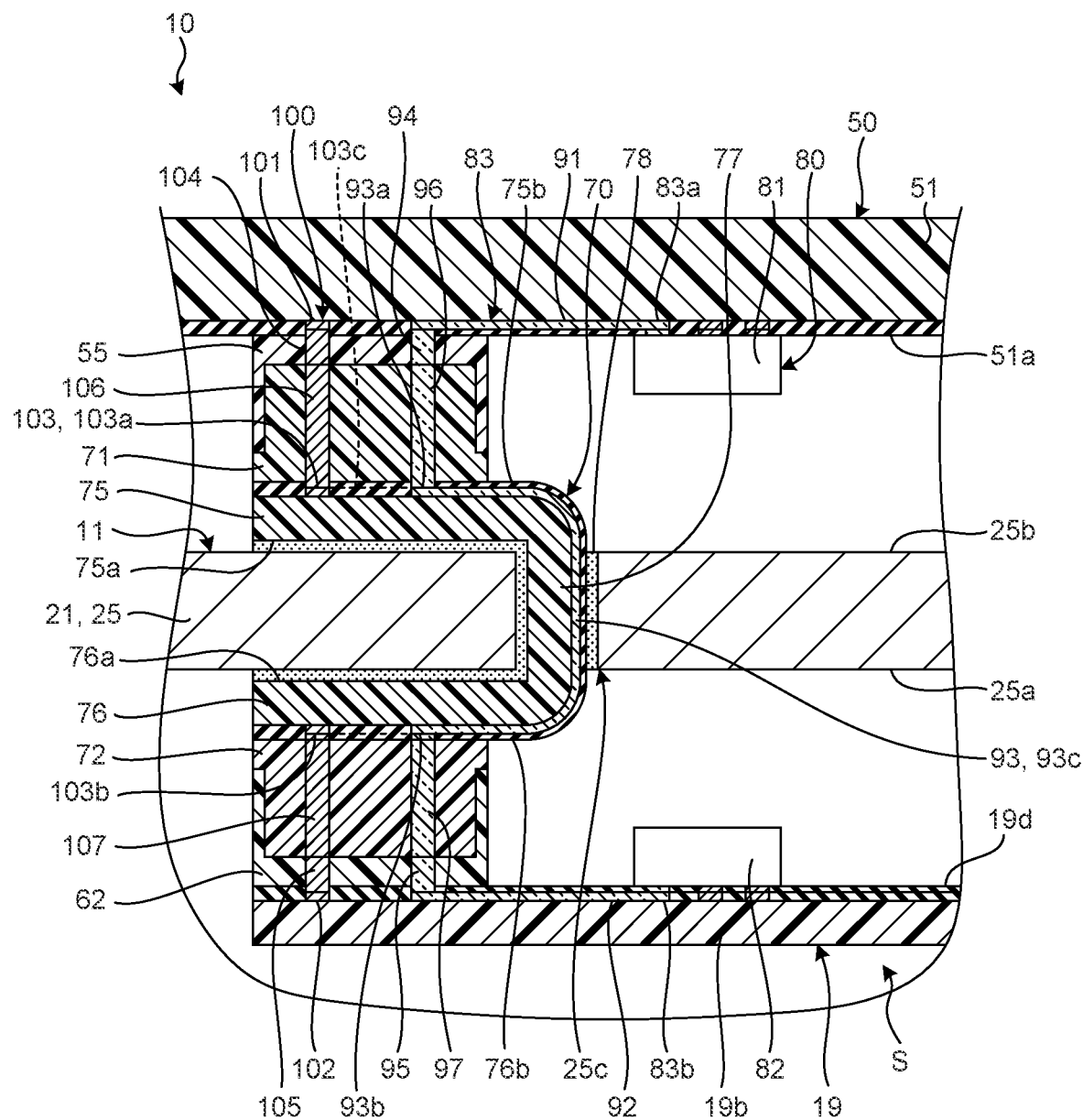
FIG. 5 is an exemplary cross-sectional view schematically illustrating a part of the HDD according to the first embodiment along line F5-F5 in FIG. 3.

Hereinbelow, the structure of the HDD 10 according to the present embodiment will be described in detail. FIG. 5 is an exemplary cross-sectional view schematically illustrating a part of the HDD 10 according to the first embodiment along line F5-F5 in FIG. 3. As illustrated in FIG. 5, the bottom wall 25 of the base 21 includes an inner surface 25a and an outer surface 25b.

The inner surface 25a faces the inside of the chassis 11. The inner surface 25a forms (defines or sections) a part of the internal space S of the chassis 11. In other words, the inner surface 25a faces the internal space S. The inner surface 25a faces various components arranged in the internal space S, such as the FPC 19.

The outer surface 25b is opposite the inner surface 25a and faces the outside of the chassis 11. The outer surface 25b faces the PCB 50 with a space. Note that the outer surface 25b and the PCB 50 may be in contact with each other.

The bottom wall 25 is provided with a slit 25c. The slit 25c is an example of a first through hole. The slit 25c penetrates the bottom wall 25 and opens to the inner surface 25a and the outer surface 25b. In other words, the slit 25c allows the internal space S and the outside of the chassis 11 to be in communication with each other.

Figure 6:
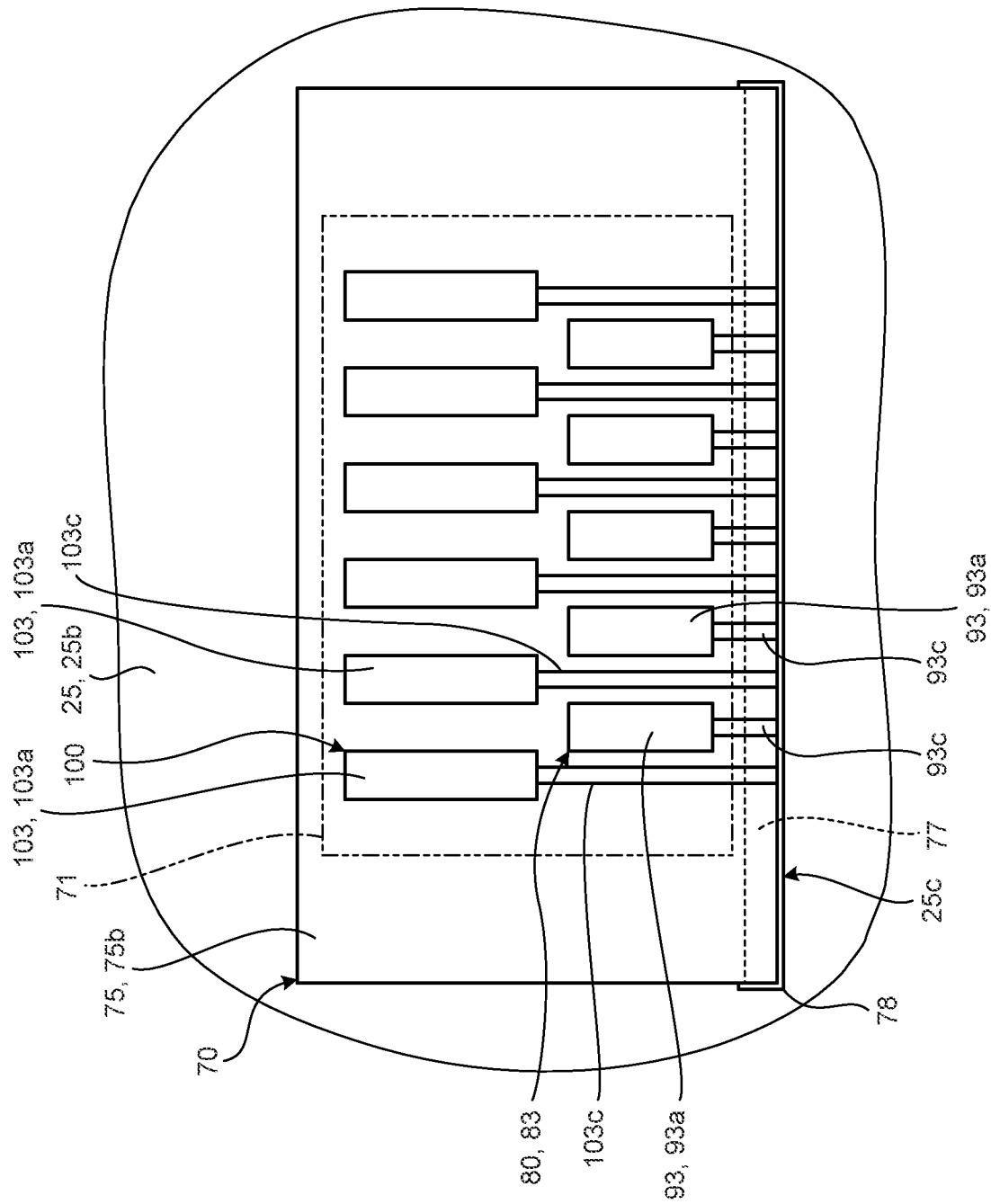
FIG. 6 is an exemplary plan view schematically illustrating a bottom wall and a relay FPC according to the first embodiment.

FIG. 6 is an exemplary plan view schematically illustrating the bottom wall 25 and the relay FPC 70 according to the first embodiment. As illustrated in FIG. 6, the slit 25c is, for example, a substantially rectangular (quadrangular) hole. Note that the shape of the slit 25c is not limited to this example.

As illustrated in FIG. 2, the FPC 19 includes a first portion 19a, a second portion 19b, and a third portion 19c. The first portion 19a is located at one end of the FPC 19. The second portion 19b is located at the other end of the FPC 19.

The first portion 19a is attached to the actuator block 35 of the actuator assembly 16 with, for example, screws. The first portion 19a is electrically connected to the flexure 43.

The second portion 19b is attached to the bottom wall 25 of the chassis 11 with, for example, screws. As illustrated in FIG. 5, the second portion 19b of the FPC 19 extends approximately along the inner surface 25a of the bottom wall 25.

As illustrated in FIG. 2, the third portion 19c is located between the first portion 19a and the second portion 19b. The third portion 19c has substantially a strip shape and has flexibility. For example, along with the rotation of the actuator assembly 16, the first portion 19a and the second portion 19b move relative to each other, and the third portion 19c bends to absorb their relative movement.

As illustrated in FIG. 5, the FPC 19 further includes a front surface 19d. The front surface 19d is one surface of the FPC 19. The first portion 19a, the second portion 19b, and the third portion 19c of the FPC 19 all partially have the front surface 19d.

In the second portion 19b, the front surface 19d faces the inner surface 25a of the bottom wall 25. Note that the front surface 19d may partially be in contact with the inner surface 25a of the bottom wall 25. The relay connector 62 protrudes from the front surface 19d in the second portion 19b.

The PWB 51 includes an inner surface 51a. The inner surface 51a faces the outer surface 25b of the bottom wall 25 with a space. The inner surface 51a covers the slit 25c of the bottom wall 25. The inner surface 51a further faces the front surface 19d of the FPC 19 through the slit 25c. The relay connector 55 protrudes from the inner surface 51a.

The relay FPC 70 includes an external portion 75, an internal portion 76, and an intermediate portion 77. Each of the external portion 75, the internal portion 76, and the intermediate portion 77 is a part of the relay FPC 70. The external portion 75, the internal portion 76, and the intermediate portion 77 are arranged in a direction in which the relay FPC 70 extends.

The external portion 75 forms one end of the relay FPC 70, for example. The external portion 75 is located outside the chassis 11. The external portion 75 extends along the outer surface 25b of the bottom wall 25, for example. Note that the external portion 75 is not limited to this example.

The internal portion 76 forms the other end of the relay FPC 70, for example. The internal portion 76 is located in the internal space S of the chassis 11. The internal portion 76 extends along the inner surface 25a of the bottom wall 25, for example. Note that the internal portion 76 is not limited to this example.

The intermediate portion 77 extends or connects between the external portion 75 and the internal portion 76. The intermediate portion 77 passes through the slit 25c. The external portion 75 extends from an end of the intermediate portion 77 located outside the chassis 11. The internal portion 76 extends from an end of the intermediate portion 77 located inside the chassis 11. In this manner, the relay FPC 70 extends across the inside and the outside of the chassis 11.

The external portion 75 includes an inner surface 75a and an outer surface 75b. The inner surface 75a faces the outer surface 25b of the chassis 11. The outer surface 75b is opposite the inner surface 75a. The outer surface 75b faces the inner surface 51a of the PWB 51 with a space. The relay connector 71 protrudes from the outer surface 75b of the external portion 75.

The internal portion 76 includes an inner surface 76a and an outer surface 76b. The inner surface 76a faces the inner surface 25a of the chassis 11. The outer surface 76b is opposite the inner surface 76a. The outer surface 76b faces the front surface 19d of the FPC 19 with a space. The relay connector 72 protrudes from the outer surface 76b of the internal portion 76.

The relay FPC 70 is secured to the bottom wall 25 with adhesive 78. The adhesive 78 secures the inner surface 75a of the external portion 75 to the outer surface 25b of the bottom wall 25, and secures the inner surface 76a of the internal portion 76 to the inner surface 25a of the bottom wall 25. Further, the adhesive 78 fills the gap between the intermediate portion 77 and the inner surface of the slit 25c. The adhesive 78 contains, for example, a metal filler to be able to prevent gas from passing through the adhesive 78. Thereby, the adhesive 78 works to airtightly seal the slit 25c.

The HDD 10 further includes a communication unit 80. The communication unit 80 performs optical communications between two components. In the present embodiment, the communication unit 80 performs optical communications between the controller 53 outside the chassis 11 and the preamplifier 61 inside the chassis 11. The communication unit 80 includes two conversion devices 81 and 82 and an optical waveguide 83. The communication unit 80 may include a plurality of optical waveguides 83. Each of the conversion devices 81 and 82 is an example of a first conversion device or a second conversion device.

Each of the conversion devices 81 and 82 includes, for example, a light source, a light receiving element, and a conversion IC. In each of the conversion devices 81 and 82 according to the present embodiment, the light source, the light receiving element, and the conversion IC are integrally formed. Note that the light source, the light receiving element, and the conversion IC of each of the conversion devices 81 and 82 may be mutually independent components.

The light source of each of the conversion devices 81 and 82 is, for example, a laser diode (LD) or a light emitting diode (LED). The light receiving element is, for example, a photodiode or a phototransistor. For example, the conversion IC causes the light source to emit light corresponding to an input electric signal, and outputs an electric signal corresponding to light incident on the light receiving element. The conversion IC may perform multiplexing. That is, each of the conversion devices 81 and 82 emits light corresponding to an electric signal and generates an electric signal corresponding to incident light. Note that one of the conversion devices 81 and 82 may include a light source to emit light, and the other may include a light receiving element to generate an electric signal.

The conversion device 81 is mounted on the PWB 51. The conversion device 81 is electrically connected to the controller 53 through an interconnection on the PWB 51. Note that other components may be interposed in the interconnection between the conversion device 81 and the controller 53.

The conversion device 82 is mounted on the FPC 19. The conversion device 82 is electrically connected to the preamplifier 61 through an interconnection on the FPC 19. Note that other components may be interposed in the interconnections between the conversion device 82 and the preamplifier 61.

The optical waveguide 83 includes, for example, a transparent core layer and a cladding layer surrounding the core layer. The refractive index of the core layer and the refractive index of the cladding layer are different from each other. Thus, the optical waveguide 83 totally reflects and transmits light incident on the core layer at the interface between the core layer and the cladding layer. Note that the optical waveguide 83 is not limited to this example.

The optical waveguide 83 is in the form of a sheet or a rod and placed inside a board such as the FPC 19 and the PWB 51. Note that the optical waveguide 83 is not limited to this example. The optical waveguide 83 of a rod form can be referred to as an optical fiber.

The optical waveguide 83 includes two ends 83a and 83b. Each of the ends 83a and 83b is an example of a first end or a second end. One end 83a is joined to the conversion device 81. The other end 83b is joined to the conversion device 82.

In the present embodiment, the term "join" refers to attaching the two components to each other for fixation. For example, the ends 83a and 83b are directly attached to the conversion devices 81 and 82 or indirectly attached thereto via other components. The ends 83a and 83b and the conversion devices 81 and 82 are attached to each other for fixation, and thereby restricted from relatively moving.

For example, in the optical waveguide 83 light is incident from one of the ends 83a and 83b and exits from the other of the ends 83a and 83b. That is, the optical waveguide 83 serves to transmit light emitted from one of the conversion devices 81 and 82 to the other.

The single optical waveguide 83 or a plurality of optical waveguides included in the optical waveguide 83 may connect between the conversion device 81 and the conversion device 82. In the optical waveguide 83 including a plurality of optical waveguides, the optical waveguides are joined to each other with, for example, a connector. As a result, the optical waveguide 83 can transmit light between the ends 83a and 83b as a whole.

In the present embodiment, the optical waveguide 83 includes a first optical waveguide 91, a second optical waveguide 92, a third optical waveguide 93, a fourth optical waveguide 94, a fifth optical waveguide 95, a sixth optical waveguide 96, and a seventh optical waveguide 97. Note that the optical waveguide 83 is not limited to this example.

The first optical waveguide 91 is included in the PWB 51, for example. Note that the first optical waveguide 91 may be an independent component from the PWB 51. The first optical waveguide 91 includes the end 83a of the optical waveguide 83. Thus, the first optical waveguide 91 is joined to the conversion device 81. Further, the first optical waveguide 91 is joined to the relay connector 55 of the PCB 50.

For example, the first optical waveguide 91 is included in one of the layers of the PWB 51. The first optical waveguide 91 is covered with an insulating layer forming the inner surface 51a of the PWB 51 except for both the ends thereof, for example. The end 83a included in the first optical waveguide 91 is exposed by an opening in the insulating layer and faces the light source and the light receiving element of the conversion device 81. The conversion device 81 is secured to the PWB 51 by soldering, for example. Thus, the end 83a is indirectly secured to the conversion device 81 via the PWB 51 and the solder. The end 83a is not limited to this example, and may be directly joined to the conversion device 81, for example.

The second optical waveguide 92 is included in the FPC 19, for example. Note that the second optical waveguide 92 may be an independent component from the FPC 19. The second optical waveguide 92 has flexibility. Thus, the second optical waveguide 92 can bend as the FPC 19 bends.

The second optical waveguide 92 includes the end 83b of the optical waveguide 83. That is, the second optical waveguide 92 is joined to the conversion device 82. Further, the second optical waveguide 92 is joined to the relay connector 62 mounted on the FPC 19.

For example, the second optical waveguide 92 is included in one of the layers of the FPC 19. The second optical waveguide 92 is covered with an insulating layer forming the front surface 19d of the FPC 19 except for both the ends thereof, for example. The end 83b included in the second optical waveguide 92 is exposed by an opening in the insulating layer and faces the light source and the light receiving element of the conversion device 82. The conversion device 82 is secured to the FPC 19 by soldering, for example. Thus, the end 83b is indirectly secured to the conversion device 82 via the FPC 19 and the solder. The end 83b is not limited to this example, and may be directly joined to the conversion device 82, for example.

The third optical waveguide 93 is included in the relay FPC 70. For example, the third optical waveguide 93 is included in one of the layers of the relay FPC 70. The third optical waveguide 93 includes an outer terminal 93a, an inner terminal 93b, and an extension 93c.

The outer terminal 93a is located on the outer surface 75b of the external portion 75 of the relay FPC 70. The inner terminal 93b is located on the outer surface 76b of the internal portion 76. For example, the outer terminal 93a and the inner terminal 93b are exposed by openings in the insulating layer of the relay FPC 70 forming the outer surfaces 75b and 76b. The extension 93c extends across the external portion 75, the internal portion 76, and the intermediate portion 77, and connects the outer terminal 93a and the inner terminal 93b.

The first to third optical waveguides 91 to 93 are formed, for example, by forming a core layer and a cladding layer on a desired part of a layer of a board by etching. As a result, the first to third optical waveguides 91 to 93 can be formed in the same or similar process as an interconnect pattern on a general PWB or a general FPC. Note that the first to third optical waveguides 91 to 93 may be formed in other methods.

The fourth optical waveguide 94 is included in the relay connector 55. The fourth optical waveguide 94 is attached to the relay connector 55 which is in the form of a plug or a socket made of synthetic resin or another material, for example.

One end of the fourth optical waveguide 94 is joined to the first optical waveguide 91. For example, the relay connector 55 is secured to the inner surface 51a of the PWB 51 with screws or adhesive. That is, one end of the fourth optical waveguide 94 is indirectly secured to the first optical waveguide 91 via the relay connector 55, the screws or the adhesive, and the PWB 51. The fourth optical waveguide 94 is not limited to this example, and may be directly joined to the first optical waveguide 91, for example.

For example, light emitted from the end of the fourth optical waveguide 94 is reflected by the end of the first optical waveguide 91 and bends at about 90°, and is transmitted by the first optical waveguide 91. Through the first optical waveguide 91, light is reflected by the end and bends at about 90°, and enters the end of the fourth optical waveguide 94.

The fifth optical waveguide 95 is included in the relay connector 62. The fifth optical waveguide 95 is attached to the relay connector 62 which is in the form of a plug or a socket made of synthetic resin or another material, for example.

One end of the fifth optical waveguide 95 is joined to the second optical waveguide 92. For example, the relay connector 62 is secured to the front surface 19d of the FPC 19 with screws or adhesive. That is, one end of the fifth optical waveguide 95 is indirectly secured to the second optical waveguide 92 via the relay connector 62, the screws or the adhesive, and the FPC 19. The fifth optical waveguide 95 is not limited to this example, and may be directly joined to the second optical waveguide 92, for example.

For example, light emitted from the end of the fifth optical waveguide 95 is reflected by the end of the second optical waveguide 92 and bends at about 90°, and is transmitted by the second optical waveguide 92. Through the second optical waveguide 92, light is reflected by the end and bends at about 90°, and enters the end of the fifth optical waveguide 95.

The sixth optical waveguide 96 is included in the relay connector 71. The sixth optical waveguide 96 is attached to the relay connector 71 which is in the form of a plug or a socket made of synthetic resin or another material, for example.

One end of the sixth optical waveguide 96 is joined to the outer terminal 93*a* of the third optical waveguide 93. For example, the relay connector 71 is secured to the outer surface 75*b* of the external portion 75 with screws or adhesive. Thus, one end of the sixth optical waveguide 96 is indirectly secured to the third optical waveguide 93 via the relay connector 71, the screw or the adhesive, and the relay FPC 70. The sixth optical waveguide 96 is not limited to this example, and may be directly joined to the third optical waveguide 93, for example.

For example, light emitted from the end of the sixth optical waveguide 96 is reflected by the outer terminal 93*a* and bends at about 90°, and is transmitted by the third optical waveguide 93. Through the third optical waveguide 93, light is reflected by the outer terminal 93*a* and bends at about 90°, and enters the end of the sixth optical waveguide 96.

By connecting the relay connectors 55 and 71 to each other, the fourth optical waveguide 94 and the sixth optical waveguide 96 are joined to each other via the relay connectors 55 and 71. As a result, the fourth optical waveguide 94 and the sixth optical waveguide 96 can transmit light to each other.

The seventh optical waveguide 97 is included in the relay connector 72. The seventh optical waveguide 97 is attached to the relay connector 72 which is in the form of a plug or a socket made of synthetic resin or another material, for example.

One end of the seventh optical waveguide 97 is joined to the inner terminal 93*b* of the third optical waveguide 93. For example, the relay connector 72 is secured to the outer surface 76*b* of the internal portion 76 with screws or adhesive. Thus, one end of the seventh optical waveguide 97 is indirectly secured to the third optical waveguide 93 via the relay connector 72, the screws or the adhesive, and the relay FPC 70. The seventh optical waveguide 97 is not limited to this example, and may be directly joined to the third optical waveguide 93.

For example, light emitted from the end of the seventh optical waveguide 97 is reflected by the inner terminal 93*b* and bends at about 90° and is transmitted by the third optical waveguide 93. Through the third optical waveguide 93, light is reflected by the inner terminal 93*b* and bends at about 90°, and enters the end of the seventh optical waveguide 97.

By connecting the relay connectors 62 and 72 to each other, the fifth optical waveguide 95 and the seventh optical waveguide 97 are joined to each other via the relay connectors 62 and 72. As a result, the fifth optical waveguide 95 and the seventh optical waveguide 97 can transmit light to each other.

In the communication unit 80, the conversion devices 81 and 82 convert an electric signal into an optical signal, transmit the optical signal through the optical waveguide 83, and convert an optical signal into an electric signal. As a result, the communication unit 80 can perform wired communications through the optical waveguide 83 using the optical signal.

The conversion devices 81 and 82 convert and generate signals in compliance with a common communication method, for example. Further, the light sources of the conversion devices 81 and 82 emit light having a frequency that can be detected by the corresponding light receiving elements. Note that the conversion devices 81 and 82 may emit infrared rays or ultraviolet rays in addition to or in place of visible light.

The controller 53 and the preamplifier 61 communicate with each other via the communication unit 80. In the present embodiment, the communication unit 80 transmits an electric signal (read signal) representing data read from the magnetic disk 12 and an electric signal (write signal) representing data to be written between the controller 53 and the preamplifier 61.

For example, at the time of reading data, the preamplifier 61 amplifies and outputs an electric signal (read signal) representing the data read from the magnetic disk 12 by the magnetic head 15. The communication unit 80 supplies the read signal amplified by the preamplifier 61 to the RWC of the controller 53.

Further, the preamplifier 61 amplifies an electric signal (write signal) representing data to be written supplied from the RWC of the controller 53 through the communication unit 80. The preamplifier 61 supplies the write signal to the magnetic head 15.

Meanwhile, the HDC of the controller 53 performs control of transmission and reception of data with respect to the electronic device 1 through the I/F connector 52, control of a buffer memory, and error correction to read data, for example.

The RWC of the controller 53 receives and modulates data to be written from the HDC and supplies the data to the preamplifier 61 through the communication unit 80, for example. Further, the RWC receives a signal read from the magnetic disk 12 from the preamplifier 61 through the communication unit 80 and demodulates the signal as digital data to output the digital data to the HDC.

The processor of the controller 53 is, for example, a CPU. The processor performs control of the HDD 10 as a whole in accordance with, for example, firmware prestored in the ROM and the magnetic disk 12. For example, the processor loads the firmware into the RAM from the ROM and the magnetic disk 12, and executes control of the magnetic head 15, the servo controller 54, the preamplifier 61, the conversion devices 81 and 82, the RWC, the HDC, and other components in accordance with the loaded firmware.

The HDD 10 further includes an energizer 100. The energizer 100 is an example of a second conductor. The energizer 100 electrically connects two or more components to each other. In the present embodiment, the energizer 100 electrically connects the PCB 50 outside the chassis 11 and the magnetic head 15 and the preamplifier 61 inside the chassis 11.

The energizer 100 includes conductive layers 101, 102, and 103 and pins 104, 105, 106, and 107. The conductive layer 103 is an example of a first conductor. The conductive layers 101, 102, and 103 and the pins 104, 105, 106, and 107 are made of a conducive material such as copper.

The conductive layer 101 is included in the PWB 51. The conductive layer 101 electrically connects the electronic components mounted on the PWB 51 to each other. For example, the conductive layer 101 electrically connects the I/F connector 52, the controller 53, the servo controller 54, and the conversion device 81 to the relay connector 55.

The conductive layer 102 is included in the FPC 19. The conductive layer 102 electrically connects the relay connector 62 to the conversion device 82, for example. Further, the conductive layer 102 electrically connects the relay connector 62 to the flexure 43. As a result, the relay connector 62 is electrically connected to the magnetic head 15 via the conductive layer 102 and the flexure 43.

The conductive layer 103 is included in the relay FPC 70. The conductive layer 103 includes an outer terminal 103*a* and an inner terminal 103*b* illustrated in FIG. 5, and an extension 103*c* illustrated in FIG. 6. As illustrated in FIG. 5, the outer terminal 103*a* is placed in the external portion 75 of the relay FPC 70. The inner terminal 103*b* is placed in the internal portion 76. The extension 103*c* extends across the external portion 75, the internal portion 76, and the intermediate portion 77, and connects the outer terminal 103*a* and the inner terminal 103*b*.

The pin 104 is provided in the relay connector 55 and connected to the conductive layer 101. The pin 105 is provided in the relay connector 62 and connected to the conductive layer 102. The pin 106 is provided in the relay connector 71 and connected to the outer terminal 103*a* of the conductive layer 103. The pin 107 is provided in the relay connector 72 and connected to the inner terminal 103*b* of the conductive layer 103. As a result, the conductive layer 103 electrically connects the pins 106 and 107 in the relay connectors 71 and 72.

The relay connectors 55 and 71 are connected to each other and the pins 104 and 106 are thereby electrically connected to each other. The relay connectors 62 and 72 are connected to each other and the pins 105 and 107 are thereby electrically connected to each other. As a result, the energizer 100 electrically connects the FPC 19 outside the chassis 11 and the magnetic head 15 and the preamplifier 61 inside the chassis 11.

The magnetic head 15 and the preamplifier 61 are supplied with electric power from the electronic device 1 through the energizer 100 and the I/F connector 52. In other words, the magnetic head 15, the preamplifier 61, and the conversion devices 81 and 82 are supplied with electric power from the PCB 50 through the relay connectors 55, 62, 71, and 72. Note that the energizer 100 may include a plurality of interconnections for grounding or control, in addition to the ones for electric power supply. In addition, the energizer 100 may include interconnections for data communications between the components mounted on the FPC 19 and the PCB 50.

Hereinbelow, an example of the operation of the HDD 10 according to the present embodiment will be described. For example, in a writing operation, the processor 1*b* of the electronic device 1 in FIG. 4 inputs a write command and data to be written into the controller 53 via the I/F connectors 1*a* and 52. In accordance with the write command, the RWC of the controller 53 inputs a write signal corresponding to the data to be written into the conversion device 81 of the communication unit 80.

The conversion IC of the conversion device 81 converts the input write signal into a drive signal and outputs the drive signal to the light source. The light source of the conversion device 81 emits light corresponding to the drive signal to the end 83*a* of the optical waveguide 83. In other words, the conversion device 81 emits light corresponding to an electric signal (write signal) representing information to be written to the magnetic disk 12 by the magnetic head 15.

The optical waveguide 83 transmits incident light from the end 83*a* to the end 83*b*. The optical waveguide 83 emits the light from the end 83*b* to the light receiving element of the conversion device 82. That is, in the optical waveguide 83, the light is incident on the end 83*a* located outside the chassis 11 and exits from the end 83*b* located inside the chassis 11.

In response to incidence of light, the light receiving element of the conversion device 82 outputs an output signal corresponding to the light to the conversion IC. The conversion IC of the conversion device 82 converts or restores the output signal into a write signal and outputs the write signal to the preamplifier 61. In other words, the conversion device 82 generates an electric signal (write signal) representing information to be written to the magnetic disk 12 by the magnetic head 15, corresponding to the light emitted from the conversion device 81.

The preamplifier 61 amplifies the write signal and outputs the write signal to the magnetic head 15. The magnetic head 15 writes data to be written included in the write signal to the recording layer of the magnetic disk 12.

Further, the controller 53 in FIG. 4 controls various components such as the VCM 17 in accordance with the write command. For example, the servo controller 54 controls the VCM 17 under the control of the controller 53. The servo controller 54 outputs a signal to the VCM 17 through the energizer 100, for example. Note that the servo controller 54 may output a signal to the VCM 17 through the communication unit 80.

In a reading operation, the processor 1*b* of the electronic device 1 inputs a read command into the controller 53 via the I/F connectors 1*a* and 52. The controller 53 causes the magnetic head 15 to read data from the recording layer of the magnetic disk 12 following the read command.

The magnetic head 15 reads intended data, and the preamplifier 61 amplifies a read signal corresponding to the read data and outputs the amplified read signal to the conversion IC of the conversion device 82. The conversion IC of the conversion device 82 converts the input read signal into a drive signal and outputs the drive signal to the light source. The light source of the conversion device 82 emits light corresponding to the drive signal to the end 83*b* of the optical waveguide 83. In other words, the conversion device 82 emits light corresponding to an electric signal (read signal) representing information read from the magnetic disk 12 by the magnetic head 15.

The optical waveguide 83 transmits the incident light from the end 83*b* to the end 83*a*. The optical waveguide 83 emits the light from the end 83*a* to the light receiving element of the conversion device 81. That is, in the optical waveguide 83 the light is incident on the end 83*b* located inside the chassis 11 and exits from the end 83*a* located outside the chassis 11.

In response to incidence of light, the light receiving element of the conversion device 81 outputs an output signal corresponding to the light to the conversion IC. The conversion IC of the conversion device 81 converts or restores the output signal into a read signal and outputs the read signal to the controller 53. In this manner, the conversion device 81 generates an electric signal (read signal) representing information read from the magnetic disk 12 by the magnetic head 15, corresponding to the light emitted from the conversion device 82.

The RWC of the controller 53 demodulates the read signal and outputs data to be read included in the read signal to the electronic device 1 through the I/F connectors 1a and 52. As a result, the electronic device 1 acquires the data read from the magnetic disk 12.

As described above, in the present embodiment, the controller 53, the conversion device 81, and the end 83a of the optical waveguide 83 are located outside the chassis 11 while the preamplifier 61, the conversion device 82, and the end 83b of the optical waveguide 83 are located inside the chassis 11. The controller 53 outside the chassis 11 and the preamplifier 61 inside the chassis 11 communicate with each other through the conversion devices 81 and 82 and the optical waveguide 83.

In the operation of the HDD 10 described above, the preamplifier 61 inside the chassis 11 and the controller 53 outside the chassis 11 mutually transmit and receive data through wired communications by means of the communication unit 80 using an optical signal. The magnetic head 15, the VCM 17, and the FPC 19 inside the chassis 11 are supplied with electric power through the energizer 100. For this reason, the relay connectors 55, 62, 71, and 72 are provided with the pins 104 to 107 for electric power supply but can omit pins for data transmission and reception.

The relay connectors 55, 62, 71, and 72 may be provided with the pins for data transmission and reception. In this case, the FPC 19 and the PWB 51 can mutually transmit and receive data partially through wired communications by means of the communication unit 80 using an optical signal and partially through wired communications using an electric signal via the relay connectors 55, 62, 71, and 72. For example, a small amount of data can be transmitted and received through wired communications using an electric signal via the relay connectors 55, 62, 71, and 72.

In the HDD 10 according to the first embodiment described above, the conversion device 81 emits light corresponding to an electric signal. The conversion device 82 generates an electric signal corresponding to incident light. The optical waveguide 83 includes the end 83a joined to the conversion device 81 and the end 83b joined to the conversion device 82, and transmits the light emitted from the conversion device 81 to the conversion device 82. The controller 53 is electrically connected to the conversion device 81. The preamplifier 61 is electrically connected to the conversion device 82, and communicates with the controller 53 through the conversion device 81, the optical waveguide 83, and the conversion device 82. That is, the controller 53 and the preamplifier 61 transmit data by means of optical communications. The optical communications excels in transmission capacity (bit rate) than electrical communications. Thus, the HDD 10 can improve the transmission capacity and reduce the number of interconnections in comparison with the data transmission by means of the electrical communications. For example, the controller 53 outside the chassis 11 and the preamplifier 61 inside the chassis 11 transmit data to each other by means of the optical communications, which makes it possible to reduce the number of interconnections between the outside and the inside of the chassis 11. As a result, in the HDD 10 it is made possible, for example, to decrease the size of the slit 25c that allows the communication between the inside and the outside of the chassis 11, and reduce a leakage of the gas from the chassis 11 through the slit 25c.

Conventionally, for example, a relay board may close a hole penetrating the bottom wall 25, and be provided with a connector for communications between the inside and the outside of the chassis 11. As the storage capacity of the HDD 10 increases, the number of pins (interconnects) of the connector may increase, which may cause an increase in size of the connector. A larger-size connector may lead to increasing the relay board in size, which may cause gas leakage through narrow holes in the relay board or adhesive applied between the chassis 11 and the relay board. This may further lead to degrading the positioning accuracy of the connector and increasing the design cost for designing a new, larger-size connector. To the contrary, the HDD 10 according to the present embodiment can reduce the number of interconnections as described above. Thus, the HDD 10 enables, for example, downsizing or omission of the relay board and the connector, and can avoid a gas leakage, a decrease in positioning accuracy between components, and an increase in design cost.

The magnetic head 15 is located inside the chassis 11 and is configured to read and write information from and to the magnetic disk 12. The conversion device 81 emits light corresponding to an electric signal (write signal) representing information to be written to the magnetic disk 12 by the magnetic head 15. Also, the conversion device 82 emits light corresponding to an electric signal (read signal) representing information read from the magnetic disk 12 by the magnetic head 15. The conversion device 82 generates a write signal corresponding to light emitted from the conversion device 81. Also, the conversion device 81 generates a read signal corresponding to light emitted from the conversion device 82. That is, the HDD 10 uses optical communications in transmission of a write signal or a read signal. As a result, the HDD 10 can increase the access speed, for example.

At least a part of the optical waveguide 83 has flexibility. This can improve the degree of freedom in designing the HDD 10. For example, by the bent optical waveguide 83 extending between the conversion devices 81 and 82, it becomes unnecessary to dispose the light sources and the light receiving elements of the conversion devices 81 and 82 to face each other.

At least a part of the optical waveguide 83 is included in the relay FPC 70. This can improve the degree of freedom in designing the HDD 10. For example, the relay FPC 70 can transmit light and electric signals and supply electric power through the optical waveguide 83 and the conductive layer 103 included in the relay FPC 70.

The conversion device 81, the end 83a, and the controller 53 are located outside the chassis 11. The conversion device 82, the end 83b, and the preamplifier 61 are located inside the chassis 11. Thus, the controller 53 outside the chassis 11 and the preamplifier 61 inside the chassis 11 transmit data by means of optical communications, which makes it possible to decrease the number of interconnections between the outside and the inside of the chassis 11. As a result, in the HDD 10, for example, it is possible to decrease the size of the slit 25c that allows the inside and the outside of the chassis 1 1 to be in communication, and reduce a leakage of gas from the chassis 11 through the slit 25c.

The relay FPC 70 includes the external portion 75 located outside the chassis 11, the internal portion 76 located inside the chassis 11, and the intermediate portion 77 passing through the slit 25c in the chassis 11 and extending between the external portion 75 and the internal portion 76. At least a part of the optical waveguide 83 is included in the relay FPC 70. As a result, the HDD 10 can dispense with a relay board, and decrease the size of the slit 25c. The HDD 10 can thus reduce a leakage of gas from inside the chassis 11, for example. Further, the HDD 10 can avoid a decrease in positioning accuracy between components and an increase in design cost.

The conductive layer 103 is included in the relay FPC 70. The conductive layer 103 includes the outer terminal 103a located in the external portion 75, the inner terminal 103b located in the internal portion 76, and the extension 103c connecting the outer terminal 103a and the inner terminal 103b. As a result, the controller 53 outside the chassis 11 can optically communicate with the preamplifier 61 inside the chassis 11 through the optical waveguide 83 of the relay FPC 70, and can supply electric power to the preamplifier 61 through the conductive layer 103 of the relay FPC 70. Thereby, the components inside the chassis 11 can be stably supplied with electric power through the conductive layer 103.

Second Embodiment

Hereinbelow, a second embodiment will be described with reference to FIG. 7. Note that, in the following description of a plurality of embodiments, components having similar functions to those of the components already described are labeled with the same reference numerals as those of the components already described, and the description thereof may be omitted. In addition, the plurality of components labeled with the same reference numerals are not necessarily common in terms of all of the functions and properties, but may have different functions and properties in accordance with each of the embodiments.

Figure 7:
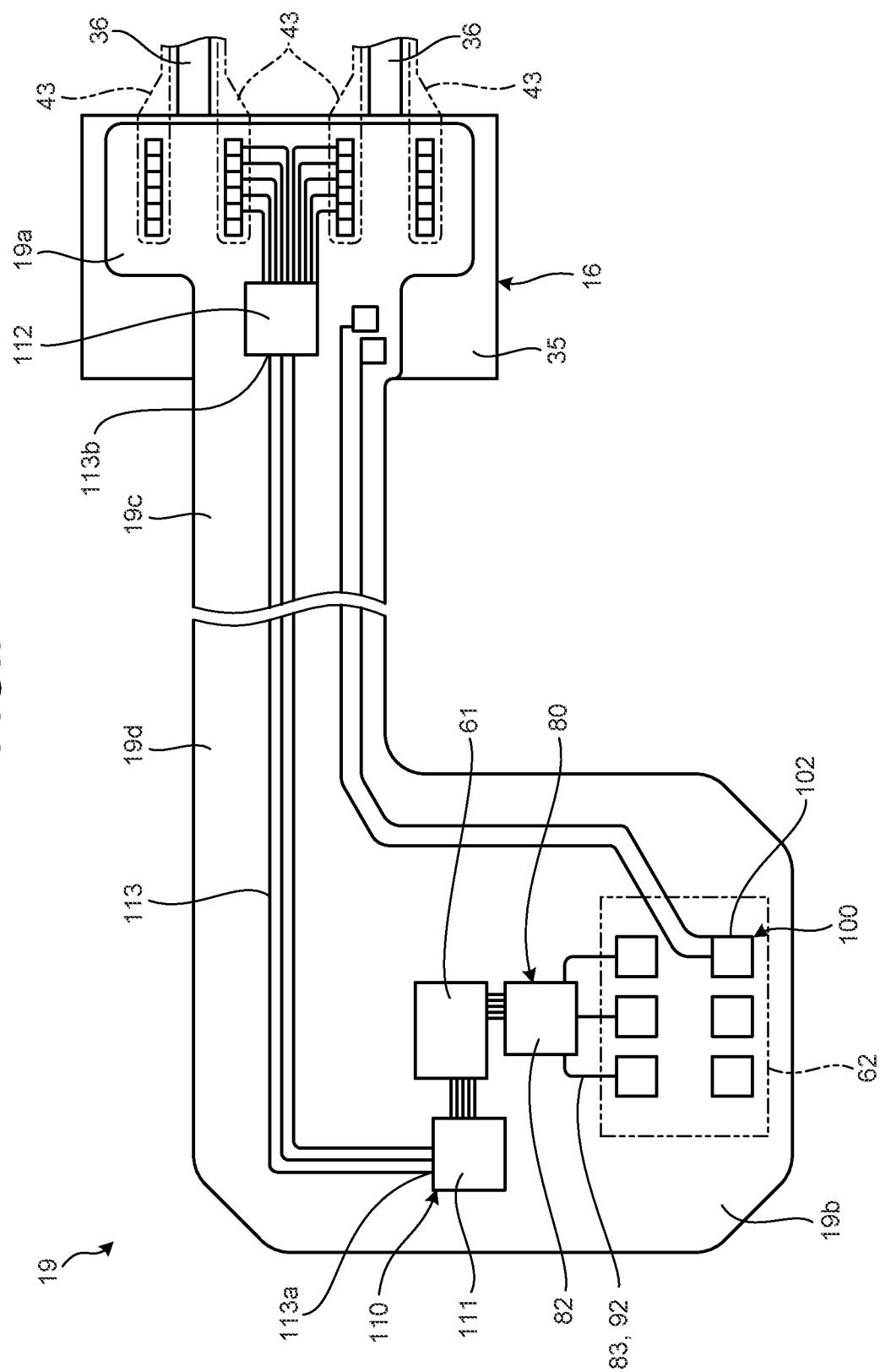
FIG. 7 is an exemplary plan view schematically illustrating an FPC according to a second embodiment.

FIG. 7 is an exemplary plan view schematically illustrating the FPC 19 according to the second embodiment. As illustrated in FIG. 7, in the second embodiment, the preamplifier 61 is provided in the second portion 19b of the FPC 19. Note that the preamplifier 61 may be provided in the third portion 19c.

The second portion 19b is larger than the first portion 19a. In general, as the storage capacity of the HDD 10 increases, the number of the preamplifiers 61 or the size of the preamplifier 61 and the number of interconnections connected to the preamplifiers 61 increase, for example. By implementing the preamplifier 61 on the relatively large second portion 19b, the interconnections in the FPC 19 can be designed easily.

Further, in the second embodiment, the HDD 10 includes a communication unit 110. Similarly to the communication unit 80, the communication unit 110 optically performs communication between two components. The communication unit 110 performs communication between the preamplifier 61 and the magnetic head 15. The preamplifier 61 and the magnetic head 15 are examples of a first component or a second component in the second embodiment.

The communication unit 110 includes two conversion devices 111 and 112 and an optical waveguide 113. The communication unit 110 may include a plurality of optical waveguides 113. Each of the conversion devices 111 and 112 is an example of a first conversion device or a second conversion device.

Similarly to the conversion devices 81 and 82, each of the conversion devices 111 and 112 includes a light source, a light receiving element, and a conversion IC. Therefore, each of the conversion devices 111 and 112 emits light corresponding to an electric signal and generates an electric signal corresponding to incident light. Note that the conversion device 111 and 112 may be different from the conversion devices 81 and 82.

Each of the conversion devices 111 and 112 is mounted on the FPC 19. The conversion device 111 is electrically connected to the relay connector 62 and the conversion device 82 through interconnections of the FPC 19. The conversion device 112 is electrically connected to the flexure 43 through interconnections of the FPC 19. Therefore, the conversion device 112 is electrically connected to the magnetic head 15 through the flexure 43.

Similarly to the optical waveguide 83, the optical waveguide 113 totally reflects and transmits light incident on the core layer at a boundary surface between the core layer and the cladding layer. The optical waveguide 113 is provided in the FPC 19 and has flexibility. Note that the optical waveguide 113 may be different from the optical waveguide 83.

The optical waveguide 113 has two ends 113a and 113b. Each of the ends 113a and 113b is an example of a first end or a second end. One end 113a is joined to the conversion device 111. The other end 113b is joined to the conversion device 112.

The optical waveguide 113 transmits light emitted from one of the conversion devices 111 and 112 to the other. The single optical waveguide 113 or a plurality of optical waveguides included in the optical waveguide 113 may be connected between the conversion device 111 and the conversion device 112.

In the communication unit 110, the conversion devices 111 and 112 convert an electric signal into an optical signal, transmit the optical signal through the optical waveguide 113, and convert an optical signal into an electric signal. As a result, the communication unit 110 can perform wired communication of the optical signal through the optical waveguide 113.

The preamplifier 61 and the magnetic head 15 communicate with each other via the communication unit 110 described above. In the present embodiment, the communication unit 110 transmits a read signal and a write signal between the preamplifier 61 and the magnetic head 15.

In a writing operation, the write signal output from the controller 53 is input into the preamplifier 61 through the communication unit 80. Note that, in the HDD 10 according to the second embodiment, the communication unit 80 may be omitted, and the write signal may be input into the preamplifier 61 through the energizer 100.

The preamplifier 61 amplifies the write signal and inputs the amplified write signal to the conversion device 111 of the communication unit 110. The conversion device 111 emits light corresponding to the write signal toward the end 113a of the optical waveguide 113.

The optical waveguide 113 transmits the light incident on the end 113a to the end 113b. The optical waveguide 113 emits the light from the end 113b toward the light receiving element of the conversion device 112.

For example, as the actuator assembly 16 rotates, the optical waveguide 113 provided in the FPC 19 flexes. However, even in a case in which the optical waveguide 113 flexes together with the FPC 19, the optical waveguide 113 can transmit the light from the conversion device 111 to the conversion device 112.

When the light is incident on the light receiving element of the conversion device 112, the conversion device 112 generates a write signal corresponding to the light emitted from the conversion device 111. The conversion device 112 outputs the write signal to the magnetic head 15 through the flexure 43. The magnetic head 15 writes data to be written included in the write signal in the recording layer of the magnetic disk 12.

On the other hand, in a reading operation, when the magnetic head 15 reads data to be read, the magnetic head 15 outputs a read signal to the conversion device 112 through the flexure 43. The conversion device 112 emits light corresponding to the read signal toward the end 113b of the optical waveguide 113.

The optical waveguide 113 transmits the light incident on the end 113b to the end 113a. The optical waveguide 113 emits the light from the end 113a toward the light receiving element of the conversion device 111.

When the light is incident on the light receiving element of the conversion device 111, the conversion device 111 generates a read signal corresponding to the light emitted from the conversion device 112. The conversion device 111 outputs the read signal to the preamplifier 61 through interconnections of the FPC 19. The preamplifier 61 amplifies the read signal and outputs the amplified read signal to the controller 53 through, for example, the communication unit 80.

In the HDD 10 according to the second embodiment described above, at least a part of the optical waveguide 113 has flexibility. This can improve the degree of freedom in designing the HDD 10. For example, the optical waveguide 113 can bend as the chassis 11 and the actuator assembly 16 move relative to each other.

At least a part of the optical waveguide 113 is included in the FPC 19. This can improve the degree of freedom in designing the HDD 10. For example, the FPC 19 can transmit light and electric signals and supply electric power through the optical waveguide 113 and the interconnections provided in the FPC 19.

The FPC 19 includes the first portion 19a attached to the actuator assembly 16, the second portion 19b attached to the chassis 11, and the flexible third portion 19c located between the first portion 19a and the second portion 19b. The preamplifier 61 is placed in the second portion 19b or the third portion 19c. The size of the first portion 19a attached to the actuator assembly 16 is limited by the size of the actuator assembly 16. This may cause, for example, difficulty in mounting the preamplifier 61 on the first portion 19a and providing the first portion 19a with interconnections to the preamplifier 61. However, the sizes of the second portion 19b and the third portion 19c are not limited by the size of the actuator assembly 16. This leads to improving the degree of freedom in placing the preamplifier 61 on the FPC 19 and improving the degree of freedom in designing the HDD 10. Meanwhile, disposing the preamplifier 61 on the second portion 19b or the third portion 19c results in elongating the distance between the preamplifier 61 and the magnetic head 15. However, in the present embodiment, the preamplifier 61 and the magnetic head 15 transmit data by means of optical communications. The optical communications cause less data loss due to distance than electrical communications. As a result, the HDD 10 can prevent occurrence of data loss in communications between the preamplifier 61 and the magnetic head 15 irrespective of a longer distance between the preamplifier 61 and the magnetic head 15.

Third Embodiment

Figure 8:
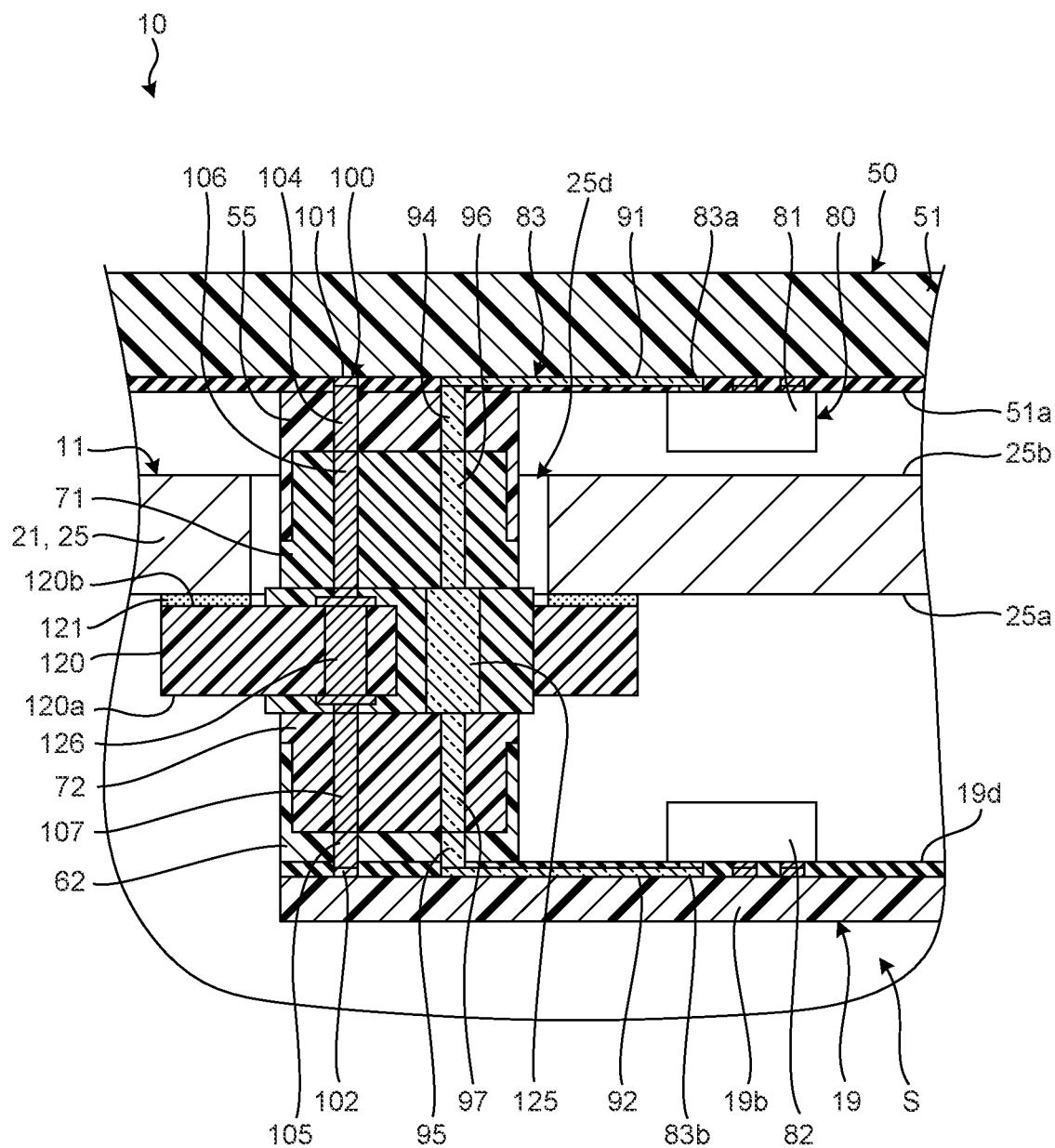
FIG. 8 is an exemplary cross-sectional view schematically illustrating a part of the HDD according to a third embodiment.

Hereinbelow, a third embodiment will be described with reference to FIG. 8. FIG. 8 is an exemplary cross-sectional view schematically illustrating a part of the HDD 10 according to the third embodiment. As illustrated in FIG. 8, in the third embodiment, a through hole 25d is provided in the bottom wall 25 instead of the slit 25c. The through hole 25d is an example of a second through hole.

The through hole 25d penetrates the bottom wall 25 and opens at the inner surface 25a and the outer surface 25b. In other words, the through hole 25d allows the internal space S and the outside of the chassis 11 to be connected with each other. The through hole 25d is, for example, a substantially rectangular (quadrangular) hole. Note that the shape of the through hole 25d is not limited to this example.

The HDD 10 according to the third embodiment includes a relay board 120 instead of the relay FPC 70. The relay board 120 is an example of a second wall. The relay board 120 is, for example, a substantially quadrangular plate made of an insulator such as synthetic resin and ceramics. Note that the relay board 120 is not limited to this example. The relay board 120 includes an inner surface 120a and an outer surface 120b.

The inner surface 120a is a substantially flat surface facing the inside of the chassis 11. The inner surface 120a forms (defines or sections) a part of the internal space S inside the chassis 11. The inner surface 120a faces a component located in the internal space S, such as the FPC 19.

The outer surface 120b is a substantially flat surface located on the opposite side of the inner surface 120a and facing the outside of the chassis 11. The area of the outer surface 120b is larger than the opening area of the through hole 25d. The outer surface 120b covers the through hole 25d from the inside of the chassis 11. A part of the outer surface 120b faces the inner surface 25a of the bottom wall 25. Another part of the outer surface 120b is exposed to the outside of the chassis 11 through the through hole 25d and faces the inner surface 51a of the PWB 51 through the through hole 25d.

For example, adhesive 121 is provided between the inner surface 25a of the bottom wall 25 and the outer surface 120b of the relay board 120 facing each other. The adhesive 121 secures the inner surface 25a of bottom wall 25 and the outer surface 120b of the relay board 120 to each other. The adhesive 121 has a metal filler mixed therein, for example, which can suppress passage of gas through the adhesive 121.

The adhesive 121 is provided along the edge of the through hole 25d and closes the gap between the inner surface 25a of the bottom wall 25 and the outer surface 120b of the relay board 120 over the entire circumference. As a result, the relay board 120 airtightly closes the through hole 25d. Note that the relay board 120 may be secured to the bottom wall 25 by other means such as solder.

In the third embodiment, the relay connectors 71 and 72 are provided on the relay board 120. The relay connector 71 protrudes from the outer surface 120b of the relay board 120 and is located outside the chassis 11. The relay connector 72 protrudes from the inner surface 120a of the relay board 120 and is located in the internal space S inside the chassis 11.

The relay connector 71 passes through the through hole 25d. Therefore, the sixth optical waveguide 96 and the pin 106 provided in the relay connector 71 pass through the through hole 25d. Note that the sixth optical waveguide 96 and the pin 106 may be housed in the through hole 25d without passing through the through hole 25d. However, the optical waveguide 83 including the sixth optical waveguide 96 passes through the through hole 25d, and is provided from the inside of the chassis 11 to the outside of the chassis 11. Also, the energizer 100 including the pin 106 passes through the through hole 25d, and is provided from the inside of the chassis 11 to the outside of the chassis 11.

In the third embodiment, the communication unit 80 includes an eighth optical waveguide 125 instead of the third optical waveguide 93. The eighth optical waveguide 125 is secured in the relay board 120 in a state of passing through the relay board 120.

For example, the eighth optical waveguide 125 is formed substantially in a rod shape. The eighth optical waveguide 125 passes through a hole provided in the relay board 120 and is secured in the relay board 120 with synthetic resin or adhesive. Note that the eighth optical waveguide 125 is not limited to this example.

One end of the eighth optical waveguide 125 is joined to the sixth optical waveguide 96. For example, the relay connector 71 is secured to the outer surface 120*b* of the relay board 120. Therefore, the eighth optical waveguide 125 is indirectly secured to the sixth optical waveguide 96 via the relay board 120 and the relay connector 71. The eighth optical waveguide 125 is not limited to this example, and may be directly joined to the sixth optical waveguide 96, for example.

The other end of the eighth optical waveguide 125 is joined to the seventh optical waveguide 97. For example, the relay connector 72 is secured to the inner surface 120*a* of the relay board 120. Therefore, the eighth optical waveguide 125 is indirectly secured to the seventh optical waveguide 97 via the relay board 120 and the relay connector 72. The eighth optical waveguide 125 is not limited to this example, and may be directly joined to the seventh optical waveguide 97, for example.

In the third embodiment, the energizer 100 includes a through conductor 126 instead of the conductive layer 103. The through conductor 126 includes, for example, a via. The through conductor 126 penetrates the relay board 120 and is connected to the pins 106 and 107.

In the HDD 10 according to the third embodiment described above, a part of the optical waveguide 83 is included in the relay connector 71 located outside the chassis 11 and the relay connector 72 located inside the chassis 11. The chassis 11 includes the bottom wall 25 provided with the through hole 25*d*. The optical waveguide 83 passes through the through hole 25*d*. That is, in the optical waveguide 83, a connection structure using the connectors is provided between the conversion device 81 and the conversion device 82. Thereby, the optical waveguide 83 can easily and communicably connect the conversion devices 81 and 82 apart from each other inside and outside the chassis 11 using the relay connectors 71 and 72, as compared with the single optical waveguide 83 directly joined to the conversion device 81 and the conversion device 82.

The energizer 100 passes through the through hole 25*d*. A part of the energizer 100 is included in the relay connector 71 and the relay connector 72. As a result, the components outside the chassis 11 can optically communicate with the components inside the chassis 11 through the relay connector 71 and the relay connector 72 via the optical waveguide 83, and can supply electric power thereto via the energizer 100. As a result, the components inside the chassis 11 can be supplied with electric power through the relay connector 71 and the relay connector 72 in a stable manner.

The relay board 120 closes the through hole 25*d*. The relay connector 71 located outside the chassis 11 and the relay connector 72 located inside the chassis 11 are disposed on the relay board 120. The optical waveguide 83 penetrates the relay board 120. For example, the relay board 120 to which the relay connector 71 and the relay connector 72 are attached is attached to the bottom wall 25. This makes it easier to attach the relay connector 71 and the relay connector 72 to the chassis 11.

Fourth Embodiment

Figure 9:
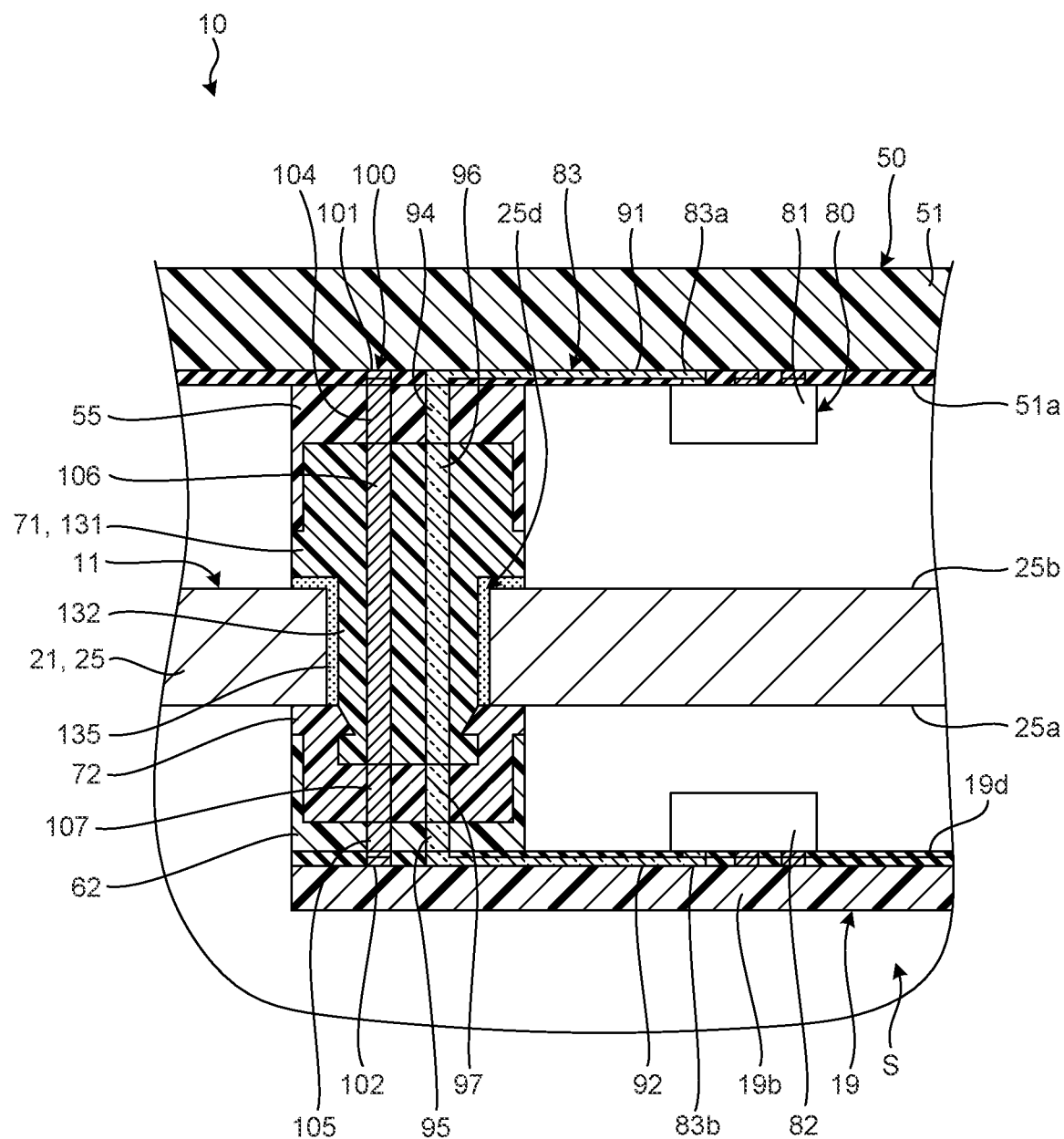
FIG. 9 is an exemplary cross-sectional view schematically illustrating a part of the HDD according to a fourth embodiment.

Hereinbelow, a fourth embodiment will be described with reference to FIG. 9. FIG. 9 is an exemplary cross-sectional view schematically illustrating a part of the HDD 10 according to the fourth embodiment. As illustrated in FIG. 9, in the HDD 10 according to the fourth embodiment, the relay board 120 is omitted from the HDD 10 according to the third embodiment.

The relay connector 71 according to the fourth embodiment includes a connection 131 and a penetrating portion 132. The connection 131 protrudes from the outer surface 25*b* of the bottom wall 25 and is located outside the chassis 11. The connection 131 is connected to the relay connector 55. The penetrating portion 132 extends from the connection 131 and passes through the through hole 25*d*. A part of the penetrating portion 132 protrudes from the inner surface 25*a* of the bottom wall 25.

The relay connector 71 is secured to the bottom wall 25 with, for example, adhesive 135. The adhesive 135 secures the connection 131 to the outer surface 25*b* of the bottom wall 25. Further, the adhesive 135 is filled between the penetrating portion 132 and the inner surface of the through hole 25*d*. The adhesive 135 has a metal filler mixed therein, for example, which can suppress passage of gas through the adhesive 135. Thus, the adhesive 135 airtightly seals the through hole 25*d*.

The relay connector 72 according to the fourth embodiment is attached to the penetrating portion 132 of the relay connector 71. For example, the relay connector 72 is attached to the penetrating portion 132 by snap-fitting. Further, the relay connector 72 may be secured to the inner surface 25*a* of the bottom wall 25 with adhesive.

By attaching the relay connector 72 to the penetrating portion 132, the sixth optical waveguide 96 provided in the relay connector 71 and the seventh optical waveguide 97 provided in the relay connector 72 are joined to each other. Further, the pins 106 and 107 provided in the relay connectors 71 and 72 are connected to each other.

The relay connector 71 according to the fourth embodiment is attached to the bottom wall 25 by, for example, inserting the penetrating portion 132 into the through hole 25*d*. Further, the relay connector 72 is attached to the penetrating portion 132 protruding from the inner surface 25*a* of the bottom wall 25 by snap-fitting. In this manner, the relay connectors 71 and 72 can be attached to the bottom wall 25 easily.

In the above description, the relay connector 71 is provided with the connection 131 and the penetrating portion 132. However, the relay connector 72 may include the connection 131 and the penetrating portion 132. In this case, the relay connector 71 is attached to the penetrating portion 132 of the relay connector 72.

In the HDD 10 according to the fourth embodiment described above, one of the relay connectors 71 and 72 includes the connection 131 located outside the through hole 25*d* and the penetrating portion 132 passing through the through hole 25*d*. The other of the relay connectors 71 and 72 is attached to the penetrating portion 132. As a result, the HDD 10 can dispense with the relay board 120, and decrease the size of the through hole 25*d*, for example. The HDD 10 can thus avoid a leakage of gas from inside the chassis 11 through the through hole 25*d*.

In the first to fourth embodiments described above, the optical waveguide 83 extends across the inside and the outside of the chassis 11 while the optical waveguide 113 is placed inside the chassis 11. The HDD 10 is not limited to this example, and may include an optical waveguide outside the chassis 11. For example, the HDD 10 may include an optical waveguide in the PWB 51.

According to at least one of the embodiments described above, a disk device includes a first conversion device, a second conversion device, an optical waveguide, a first component, and a second component. The first conversion device emits light corresponding to an electric signal. The second conversion device generates an electric signal corresponding to incident light. The optical waveguide includes a first end joined to the first conversion device and a second end joined to the second conversion device, and transmits light emitted from the first conversion device to the second conversion device. The first component is electrically connected to the first conversion device. The second component is electrically connected to the second conversion device, and communicates with the first component through the first conversion device, the optical waveguide, and the second conversion device. That is, the first component and the second component transmit data by means of optical communications. The optical communications excel in transmission capacity (bit rate) than electrical communications. Thus, the disk device can improve the transmission capacity and reduce the number of interconnections than data transmission by means of electric-signal communications. For example, components inside and outside a chassis transmit data to each other by means of the optical communications, thereby reducing the number of interconnections between the outside and the inside of the chassis. As a result, for example, it is possible for the disk device to decrease the size of a through hole that allows the inside and the outside of the chassis to be in communication and decrease the size of a wall that closes the through hole, reducing a leakage of gas from inside the chassis through the through hole and the wall.

In the above description, wards "suppress" and "prevent" are defined as, for example, to prevent the occurrence of an event, an effect, or an influence, or to reduce the degree of the event, the effect, or the influence. Also, in the above description, wards "limit" and "restrict" are defined as, for example, to prevent movement or rotation, or to allow movement or rotation within a predetermined range and to prevent movement or rotation beyond the predetermined range.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk device comprising:
   a chassis;
   a recording medium having a disk form, located inside the chassis, and including a recording layer;
   a magnetic head located inside the chassis, the magnetic head configured to read and write information from and to the recording medium;
   a first conversion device that emits light corresponding to an electric signal;
   a second conversion device that generates an electric signal corresponding to incident light
   an optical waveguide including a first end joined to the first conversion device, and a second end joined to the second conversion device, the optical waveguide transmitting light emitted from the first conversion device to the second conversion device;
   a first component electrically connected to the first conversion device; and
   a second component electrically connected to the second conversion device, the second component communicating with the first component through the first conversion device, the optical waveguide, and the second conversion device,
   wherein the first conversion device emits light corresponding to one of:
      a first electric signal representing information to be written to the recording medium by the magnetic head, and
      a second electric signal representing information read from the recording medium by the magnetic head,
   the second conversion device generates the one of the first electric signal and the second electric signal corresponding to the light emitted from the first conversion device,
   one of a first group including the first conversion device, the first end, and the first component, and a second group including the second conversion device, the second end, and the second component is located outside the chassis, and
   the other of the first group and the second group is located inside the chassis.

2. The disk device according to claim 1, further comprising:
   a second flexible printed circuit board including:
      an external portion located outside the chassis,
      an internal portion located inside the chassis, and
      an intermediate portion located between the external portion and the internal portion, and passing through a first through hole in the chassis, wherein
   at least part of the optical waveguide is included in the second flexible printed circuit board.

3. The disk device according to claim 2, further comprising:
   a first conductor included in the second flexible printed circuit board and including an inner terminal provided in the internal portion, an outer terminal provided in the external portion, and an extension connecting the inner terminal to the outer terminal.

4. The disk device according to claim 1, further comprising:
   a first connector located outside the chassis and including a part of the optical waveguide; and
   a second connector located inside the chassis and including a part of the optical waveguide, wherein the chassis includes a first wall provided with a second through hole, and
   the optical waveguide passes through the second through hole.

5. The disk device according to claim 4, further comprising:
   a second conductor that passes through the second through hole, wherein
   the second conductor is partly included in the first connector and the second connector.

6. The disk device according to claim 4, further comprising:
   a second wall that closes the second through hole, wherein
   the first connector and the second connector are disposed on the second wall, and
   the optical waveguide penetrates the second wall.

7. The disk device according to claim 4, wherein
   a first one of the first connector and the second connector includes a connection located outside the second through hole and a penetrating portion passing through the second through hole, and a second one of the first connector and the second connector is attached to the penetrating portion.

8. A disk device comprising:

a chassis;

a recording medium having a disk form, located inside the chassis, and including a recording layer;

a magnetic head located inside the chassis, the magnetic head configured to read and write information from and to the recording medium;

a first flexible printed circuit board;

an actuator that moves the magnetic head;

an amplifier that amplifies an electric signal;

a first conversion device that emits light corresponding to an electric signal;

a second conversion device that generates an electric signal corresponding to incident light;

an optical waveguide including a first end joined to the first conversion device, and a second end joined to the second conversion device, the optical waveguide transmitting light emitted from the first conversion device to the second conversion device;

a first component electrically connected to the first conversion device; and a second component electrically connected to the second conversion device, the second component communicating with the first component through the first conversion device, the optical waveguide, and the second conversion device, wherein the first flexible printed circuit board includes:
  a first portion attached to the actuator,
  a second portion attached to the chassis, and
  a third portion having flexibility and located between the first portion and the second portion, the amplifier is included in the second portion or the third portion, a first one of the first component and the second component includes the amplifier, and a second one of the first component and the second component includes the magnetic head.

9. The disk device according to claim 8, wherein the first conversion device emits light corresponding to one of:
  a first electric signal representing information to be written to the recording medium by the magnetic head, and
  a second electric signal representing information read from the recording medium by the magnetic head, and the second conversion device generates the one of the first electric signal and the second electric signal corresponding to the light emitted from the first conversion device.

10. The disk device according to claim 9, wherein at least part of the optical waveguide has flexibility.

11. The disk device according to claim 10, wherein the at least part of the optical waveguide is included in the first flexible printed circuit board.

12. A disk device comprising:

a first conversion device that emits light corresponding to an electric signal;

a second conversion device that generates an electric signal corresponding to incident light;

an optical waveguide including a first end joined to the first conversion device, and a second end joined to the second conversion device, the optical waveguide transmitting light emitted from the first conversion device to the second conversion device;

a first component electrically connected to the first conversion device;

a second component electrically connected to the second conversion device, the second component communicating with the first component through the first conversion device, the optical waveguide, and the second conversion device;

a chassis;

a recording medium having a disk form, located inside the chassis, and including a recording layer;

a magnetic head located inside the chassis, the magnetic head configured to read and write information from and to the recording medium;

a second flexible printed circuit board including:
  an external portion located outside the chassis,
  an internal portion located inside the chassis, and
  an intermediate portion located between the external portion and the internal portion, and passing through a first through hole in the chassis, wherein the first conversion device emits light corresponding to one of:
    a first electric signal representing information to be written to the recording medium by the magnetic head, and
    a second electric signal representing information read from the recording medium by the magnetic head,
  the second conversion device generates the one of the first electric signal and the second electric signal corresponding to the light emitted from the first conversion device, and at least part of the optical waveguide is included in the second flexible printed circuit board.

* * * * *